(12) United States Patent
Van Gestel et al.

(10) Patent No.: US 7,662,702 B2
(45) Date of Patent: Feb. 16, 2010

(54) METHOD FOR MANUFACTURING A CRYSTALLINE SILICON LAYER

(75) Inventors: Dries Els Victor Van Gestel, Vosselaar (BE); Guy Beaucarne, Oud-Heverlee (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 11/146,564

(22) Filed: Jun. 7, 2005

(65) Prior Publication Data
US 2006/0030132 A1 Feb. 9, 2006

Related U.S. Application Data

(60) Provisional application No. 60/577,556, filed on Jun. 7, 2004.

(51) Int. Cl.
H01L 21/20 (2006.01)
H01L 21/36 (2006.01)

(52) U.S. Cl. ............... 438/486; 438/488; 257/E21.133; 257/E21.297

(58) Field of Classification Search ................ 438/486, 438/488, FOR. 403, FOR. 405, FOR. 488; 257/E21.133, E21.295, E21.297
See application file for complete search history.

(56) References Cited

U.S. PATENT DOCUMENTS

| 3,961,997 A * | 6/1976 | Chu | 438/97 |
|---|---|---|---|
| 4,400,715 A * | 8/1983 | Barbee et al. | 257/74 |
| 4,818,337 A * | 4/1989 | Barnett et al. | 136/256 |
| 5,147,468 A * | 9/1992 | Deguchi | 136/244 |
| 5,844,351 A * | 12/1998 | Jones et al. | 313/310 |
| 5,952,242 A * | 9/1999 | Pietsch et al. | 438/692 |
| 6,099,662 A * | 8/2000 | Wang et al. | 134/26 |
| 6,241,817 B1 * | 6/2001 | Jang et al. | 117/8 |
| 2002/0025614 A1 * | 2/2002 | Jang et al. | 438/158 |
| 2002/0109152 A1 * | 8/2002 | Kobayashi et al. | 257/177 |

FOREIGN PATENT DOCUMENTS

| JP | 08-022991 | * | 1/1996 |
| WO | 2004/033769 | * | 4/2004 |
| WO | WO 2004/033769 A | | 4/2004 |

OTHER PUBLICATIONS

Pihan et al, "Polycrystalline Silicon Films on Ceramic Substrates by Aluminum-Induced Crystallisation Process", 3rd World Conference on Photovoltaic Energy Conversion, May 11-18, 2003. Osaka, Japan. 1182-1185.*

(Continued)

Primary Examiner—Matthew Smith
Assistant Examiner—Quovaunda Jefferson
(74) Attorney, Agent, or Firm—Knobbe Martens Olson & Bear LLP

(57) ABSTRACT

A method of forming a crystalline silicon layer on a microrough face of a substrate by reducing the microroughness of the face and then performing a metal induced crystallization process on the face is disclosed.

11 Claims, 28 Drawing Sheets

OTHER PUBLICATIONS

Widenborg et al, "Surface Morphology of Poly-Si Films Made by Aluminum-Induced Crystallisation on Glass Substrates", 2002, Journal of Crystal Growth 242, pp. 270-282.*

Bremhe et al., IEEE trans. el. Dev. 46 (1999) 2062.

Gall et al., Proceedings PV in Europe (2002) 87.

Harder et al., Proceedings 28th IEEE PVSC (2000).

Pihan et al., "Formation of polycrystalline silicon on foreign substrates by combination of CVD and Aluminium-Induced crystallization techniques" Conference "PV in Europe", Rome 2002.

Suryanarayanan, R., "Plasma Spraying: Theory and Applications," World Scientific, 1993, ISBN 9810213638, 9789810213633, Chapter 6.

Hattori, T., Editor, "Ultra clean surface processing of silicon wafers — secrets of VLSI manufacturing", Jan. 1, 1998, Springer-Verlag, Berlin, XP002549423, p. 60, lines 1-7.

Ishii et al., "Sub-5 mm thin film crystalline silicon solar cell on alumina ceramic substrate", Japanese Journal of Applied Physics, Japan Society of Applied Physics, Tokyo, JP, vol. 32, No. 6A, Part 02, Jun. 1, 1993, pp. L770-L773.

Letavic et al., "Recrystallized silicon-on-alumina as a monolithic circuit technology", IEEE 1989 MTTS International Microwave Symposium Digest (Cat. No. 89CH2725-0) IEEE, New York, NY, USA, vol. 1, Jan. 1, 1989, pp. 969-972.

* cited by examiner

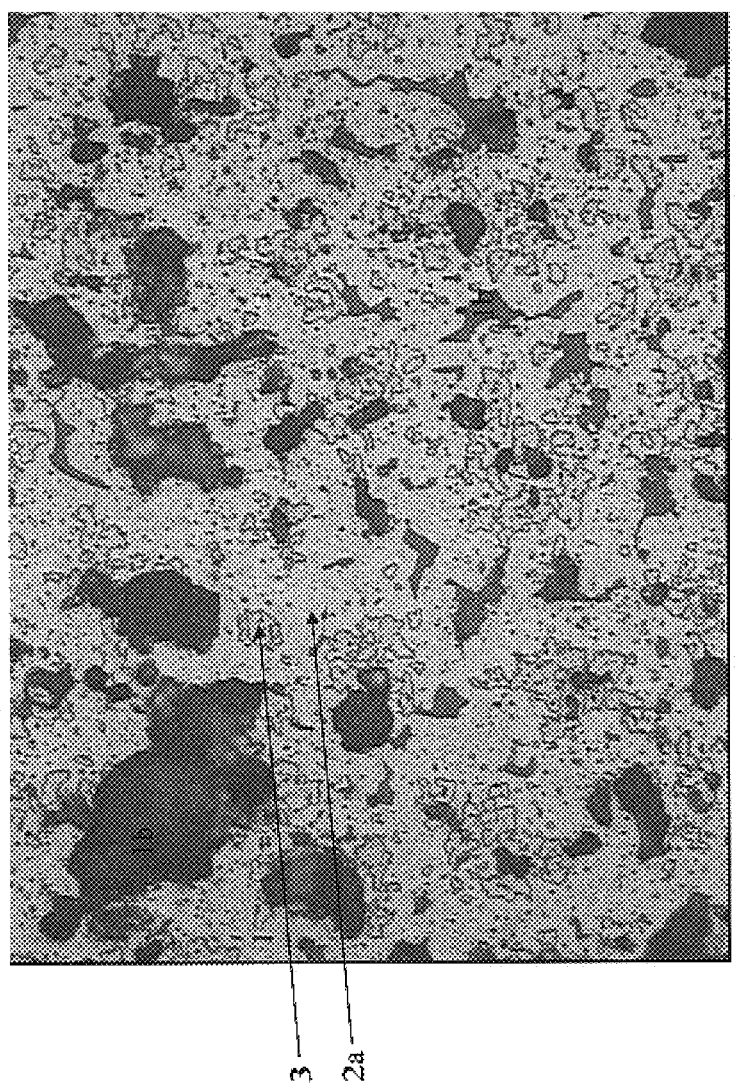

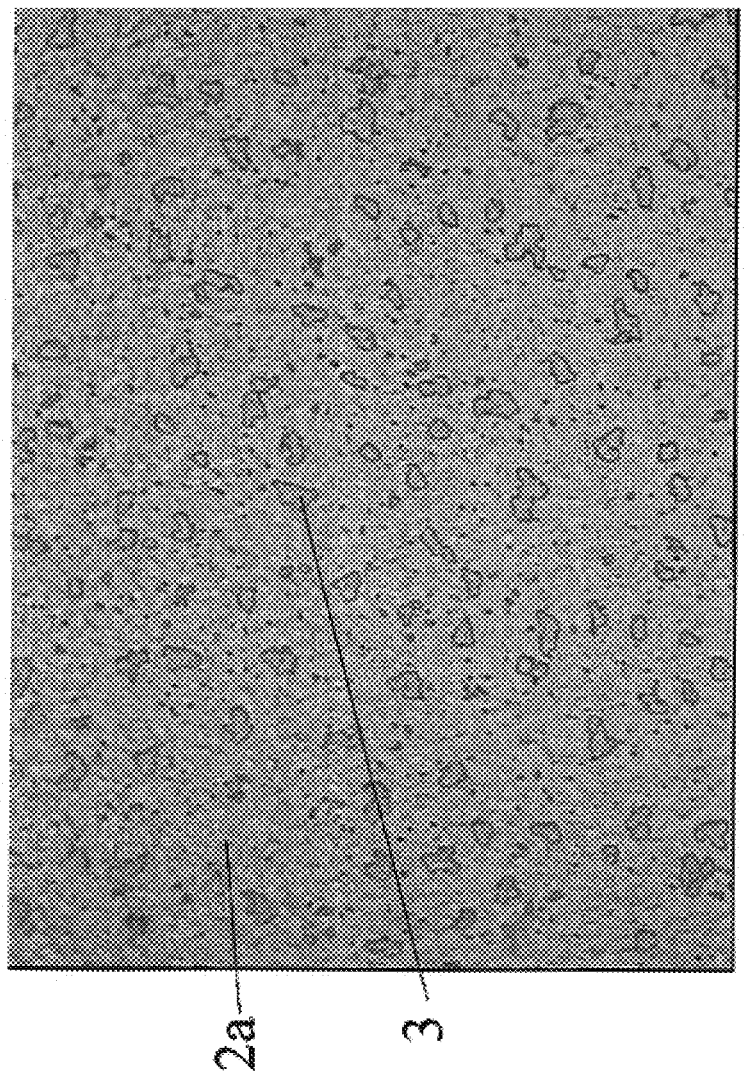

METHOD FOR MANUFACTURING A CRYSTALLINE SILICON LAYER

RELATED APPLICATION

This application claims priority to U.S. Application No. 60/577,556 filed on Jun. 7, 2004, which is incorporated herein by reference in its entirety.

BACKGROUND OF THE INVENTION

1. Field of the Invention

The present invention relates to the field of manufacturing methods for crystalline silicon layers on a substrate. More specifically it relates to a Metal Induced Crystallization process. The present invention further relates to the application of such a method in the manufacturing process of electronic devices such as solar cells.

2. Description of the Related Art

Thin-film crystalline Si solar cells on cheap foreign substrates are a promising alternative to traditional bulk crystalline silicon solar cells because of their higher potential for cost reduction. However, most of these approaches have led to devices with much lower efficiency than traditional solar cells. A major reason is the lower crystallographic quality of the layers obtained by deposition and/or crystallization.

One approach to crystallization is to use the metal-induced crystallization phenomenon (MIC), also known as metal induced layer exchange phenomenon, to create a thin layer with large grains, typically followed by epitaxial deposition. Examples of this technique are given in for instance S. Gall, J. Schneider, M. Muske, I. Sieber, O. Nast, W. Fuhs, Proceedings PV in Europe (2002) 87; N. P. Harder, J. A. Xia, S. Oelting, O. Nast, P. Widenborg, A. G. Aberle, Proceedings 28th IEEE PVSC (2000); S. Brehme O. Nast, D. Neuhaus, S. Wenham, IEEE trans. el. Dev. 46 (1999) 2062; all of which are incorporated herein by reference in their entirety.

One particular example of MIC is aluminium induced crystallization (AIC). AIC can be summarized as follows. First a metal layer, e.g. an aluminium layer, is deposited on a foreign substrate. Next, the metal layer, e.g. aluminium layer, is oxidized (for instance by exposure to air) to form a thin layer of metal oxide, e.g. aluminium oxide. Then, amorphous silicon is deposited on the metal oxide layer (e.g. an aluminium oxide layer). The sample is then annealed at a temperature below the eutectic point of the silicon-aluminium oxide.

During annealing, a layer exchange takes place: the silicon atoms diffuse into the metal layer (e.g. Al layer) and crystallize together. The metal atoms (e.g. Al atoms) move to the top surface. If the layer exchange process is successful, the final structure consists of a continuous layer of large grain polycrystalline silicon on the foreign substrate covered by a metal layer (e.g. an Al layer) with Si enclosures. The metal layer (e.g. Al layer) is then etched away. The resulting silicon layer may contain some secondary crystallites that were formed in the top metal layer (e.g. Al layer) during crystallization. These secondary crystallites are referred to as 'islands'. An additional layer can be deposited epitaxially on the seed layer, reproducing the grain structure of the seed layer.

If the epitaxy process is done at low temperature (e.g. by using ECR PECVD or Ion-assisted deposition), low-cost glass can be used. In the context of solar cell manufacturing, this use could lead to very low cost solar cells; however, low temperature epitaxy on imperfect surfaces presents a serious technological challenge.

Alternatively, the epitaxial growth can be done with a high temperature technique (e.g. thermal chemical vapour deposition). Using a high temperature technique has advantages (good epitaxial quality with simple process), but also imposes restrictions on the possible foreign substrates. Standard low-cost glass cannot be used because it cannot withstand high temperatures. Therefore ceramic substrates are often considered for the high temperature route. At present, most of the research on AIC for thin film solar cells on foreign substrates is done on glass. On glass the poly-silicon layer is very smooth with less islands of silicon. Aluminium-induced crystallization on ceramic however results in an average grain size that is low (e.g., ~1-2 micron), and a high density of islands.

In "Formation of polycrystalline silicon on foreign substrates by combination of CVD and Aluminium-Induced crystallization techniques", E Pihan, A. Slaoui, M. Rusu, Conference "PV in Europe", Rome 2002, which is incorporated herein by reference in its entirety, nucleation and growth of polycrystalline silicon layers on foreign substrates using the aluminium induced crystallization process (AIC) of amorphous silicon is presented. The foreign substrates used are mullite ceramic substrates as well as thermally-oxidized silicon substrates. It is shown that the combination of AIC and thermal CVD can be applied on ceramic substrates, though the quality of the resulting crystalline silicon layer is much lower on the mullite substrates then on the thermally-oxidized silicon substrates, illustratively shown in FIG. 2 of this paper, because the density of grains on mullite substrates is much higher than the density of grains on thermally oxidized silicon substrates, and thus the grain size much smaller.

Parameters that can define the quality of a crystalline film created by an MIC technique are grain size, continuity of the layer, island density, crystallographic properties (e.g., defects and grain boundaries) and electrical properties.

Crystals are referred to herein based on their grain sizes, as provided in Table 1. The term "crystalline silicon" refers to silicon of all crystal types, but excludes amorphous silicon.

TABLE 1

| Grain size of silicon crystal | Name |
| --- | --- |
| Atomic size | Amorphous |
| Atomic size - 10 nm | Nanocrystalline |
| 10 nm-1 µm | Micro crystalline |
| 1 µm-100 µm | Polycrystalline |
| 100 µm-1 mm | Multi crystalline |
| Infinite | Mono crystalline |

While the above-described methods of MIC have produced crystalline silicon on foreign substrates, these techniques have not produced silicon layers with high enough crystalline quality for many uses, such as use in solar cells. Accordingly, there is an unmet need for an improved method of forming crystalline silicon on foreign substrates.

SUMMARY OF CERTAIN EMBODIMENTS

One embodiment disclosed herein includes a method of forming a crystalline silicon layer on a face of a substrate, the face being microrough prior to forming the layer, the method including reducing the amount of the microroughness on the face and performing a metal induced crystallization process on the face. In one embodiment, the reduction of the microroughness on the face is performed by depositing a microflattening layer on the microrough face. In one embodiment, microflattening layer is a dielectric layer. In one embodiment, the dielectric layer comprises a spin-on dielectric, a flowable dielectric, a dip-on dielectric, or a spray-on dielectric. In one embodiment, the dielectric layer comprises a spin-on glass, SiO$_2$, or an oxide other than SiO$_2$. In one embodiment, the substrate comprises a ceramic material, glass, or a glass-ceramic material. In one embodiment, the substrate comprises mullite, alumina, or Silicon Nitride. In one embodiment, the face has a microroughness below 1 rad/μm after the step of reducing the value of the microroughness. one embodiment further comprises reducing the amount of macroflatness on the face prior to performing the metal induced crystallization process on the face. In one embodiment, the metal induced crystallization process is an aluminium induced crystallization process. One embodiment further includes epitaxially depositing a silicon layer on the face and constructing a solar cell from the substrate with crystalline silicon layer.

Another embodiment disclosed herein includes a wafer for use in a solar cell, including a substrate comprising a microrough face, a dielectric disposed on the microrough face, wherein the surface of the dielectric after deposition is less microrough than the microrough face, and crystalline silicon disposed on the dielectric.

BRIEF DESCRIPTION OF THE DRAWINGS

FIG. 8a shows sample 1: polished mullite/AIC

FIG. 11a shows sample 9: alumina/spin-on oxide/AIC

FIG. 11b is a SEM picture of the same area.

FIG. 8b is a SEM picture of the same area.

FIG. 10b is a SEM picture of the same area.

Figure 1:
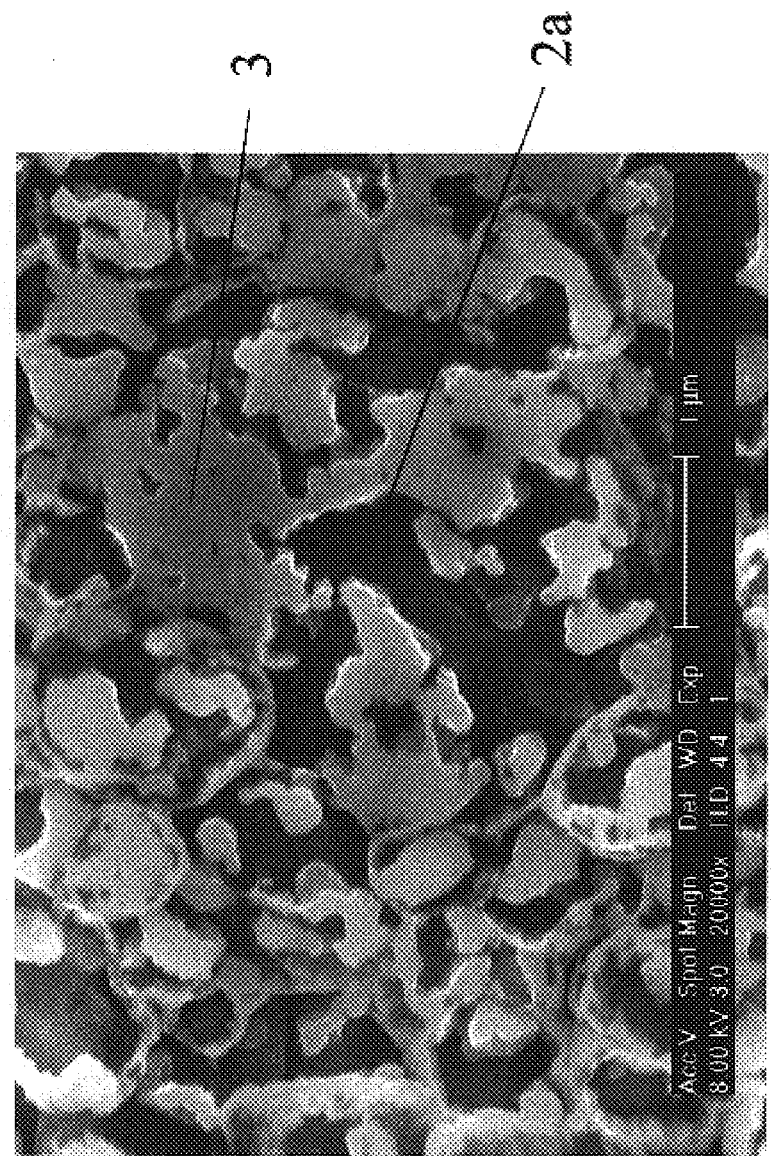
FIG. 1 is a SEM top view of an AIC layer formed directly on a ceramic (Alumina) substrate.

The figures with EBSD samples are depicted at the original aspect ratio and the x and y dimensions both have the same scale, as shown. The scale itself is part of the figures and is therefore not deformed.

DETAILED DESCRIPTION OF CERTAIN EMBODIMENTS

Certain embodiments are described in detail below. It is apparent, however, that a person skilled in the art can imagine several other equivalent embodiments or other ways of executing the present invention, the spirit and scope of the present invention being limited only by the terms of the appended claims.

In one embodiment, a method is provided for improving the MIC formation of crystalline silicon on a substrate including AIC formation on microrough substrates such as ceramic substrates (e.g., mullite or alumina substrates). Without being limited to any particular theory, it is believed that the quality of the polycrystalline layer resulting from an MIC process, including the AIC process, is at least partially determined by the microroughness of the underlying layer. Accordingly, in one embodiment, a method is provided for forming a crystalline silicon layer on the face of a substrate that is microrough prior to forming the layer by reducing the amount of microroughness prior to formation of the silicon layer.

In one embodiment, the method comprises reducing the microroughness of a face of a substrate and then performing a metal induced crystallization process on the face. Different possibilities are disclosed for reducing the microroughness of the face. The surface can for example be polished or a microflattening layer may be deposited on the microrough face. The microflattening layer may be a dielectric layer, for example an oxide layer, but is not limited thereto. The intermediate dielectric layer may lead to a substrate surface with a smaller microroughness. Such a reduced microroughness can result in an MIC seed layer, e.g. an AIC seed layer, with much larger grains and a much lower islands density. After the epitaxial deposition, a polycrystalline silicon layer on ceramic with large grain size may thus be obtained. In some embodiments, the grain size obtained is larger than 5 μm.

The initial microrough substrate may comprise a ceramic material, glass or a glass-ceramic material. The substrate can be any microrough substrate. Preferably it comprises mullite, alumina or silicon nitride. In some embodiments, any reduction of microroughness of the underlying layer or substrate results in a better performance of the MIC, e.g. AIC, process on top. The value μRN may be used to indicate on which substrate MIC, e.g. AIC, will give the best results. An additional microroughness reducing step can be applied. The same step may have a different impact on the microroughness of different substrates.

Since the μRN parameter only takes into account geometric features of a substrate surface, it is believed that its use is even more appropriate when comparing values on the same types of substrates, or still more appropriate when comparing values on a single substrate before and after a microflattening step. It can of course also be used to develop techniques for performing microflattening steps.

The dielectric may comprise a spin-on dielectric, e.g. spin-on oxide, a flowable dielectric, e.g. flowable oxide (which can sometimes also be a spin-on oxide), a dip-on dielectric, e.g. dip-on oxide, or a spray-on dielectric, e.g. spray-on oxide. In some embodiments, the dielectric may comprise a spin-on glass or $SiO_2$.

The metal induced crystallization process may be an aluminium induced crystallization process. The metal or Aluminium induced crystallization process is known in the art, and typically comprises the steps of (e.g. AIC):

a. Metal, e.g. Aluminium, deposition;
b. Metal, e.g. Aluminium, oxidation;
c. Amorphous silicon deposition;
d. Annealing;
e. Metal, e.g. Al, removal.

The resulting seed layer can then advantageously be used for further epitaxial layer deposition, resulting in a polycrystalline layer of high quality. This epitaxially deposited layer can then advantageously be used for solar cell applications and manufacturing.

In some embodiments, a solar cell is manufactured from the resulting silicon layer. Any standard solar cell processing can be performed, such as for example: phosphor diffusion emitter or heterojunction emitter, bulk and surface passivation, metallization, and isolation of the cells.

As used herein, a "microrough" surface is a surface which has a roughness at a microscopic scale. Microroughness differs from roughness typically referred to in the art as RMS roughness (i.e., macroroughness). A surface can be macrorough but not microrough. Alternatively, a surface can be macroflat and at the same time microrough.

Figure 15:
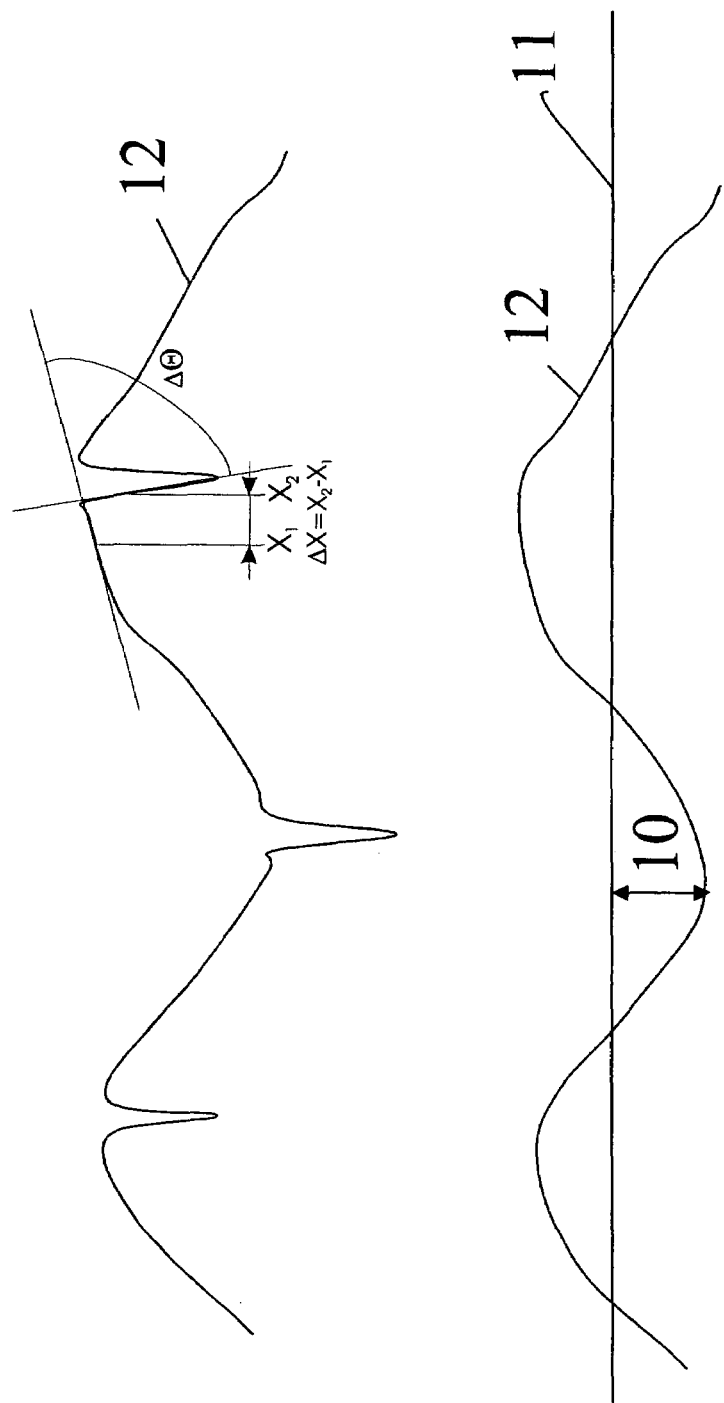
FIG. 15 is an illustration of the difference between macroroughness and microroughness; both surfaces illustrated are rough and have about the same RMS roughness. Their microroughness differs though, the upper part of the drawing showing a larger microroughness than the bottom part, resulting in different MIC process qualities.

The degree of macroroughness can be quantified by the maximum deviation from an average level line 11, as illustrated in FIG. 15. An average level line 11 is a reference line from which profile deviations are measured. As an average level line 11, one can use the least squares mean line, which is a line through a profile 12 such that the sum of the squares of the deviations 10 of the profile from the average level line 11 is minimized. A measure for the macroroughness can be the maximum deviation from this average level line 11.

An average level line 11 can be determined from cross-sectional SEM or TEM pictures over a distance of minimum 1 μm and long enough to have a characteristic profile for the sample (typically maximum 15 μm). A surface is defined as macrorough when the maximum deviation from the average level line 11 exceeds 50 nm. If not, the surface is defined to be macroflat.

In FIG. 15, the difference between macroroughness and microroughness is illustrated. Both profiles 12 illustrated are macrorough and have about the same RMS roughness. However, the top profile 12 has a larger microroughness than the bottom profile 12.

The degree of microroughness can be quantified by the parameter μRN, defined as the relative mean distance and variance between two side by side microrough defects along a characteristic profile line of the surface. As illustrated in FIG. 15, a microrough defect is a place were $|\Delta\Theta/\Delta x|$ is higher than a threshold value, where $\Delta\Theta$ is the angle between two tangential lines to a characteristic profile line 12 of the surface at two points $x_1$ and $x_2$, and $\Delta x = x_2 - x_1$ is the distance between the orthogonal projections of the two points $x_2$ and $x_1$ onto a parallel of a least square fitted straight line of the characteristic profile line 12. In one embodiment, the threshold value is higher than about 1 rad/μm, preferably higher than about 2 rad/μm. In one embodiment, $\Delta x$ is on the order of between about 0.03 μm and about 0.5 μm, preferably between about 0.05 μm and about 0.3 μm, typically about 0.1 μm. A surface is considered "microrough" if any location on the surface can be found where $|\Delta\Theta/\Delta x| > 1$ rad/μm.

The relative mean distance between two microrough defects can be calculated from a characteristic profile line for the sample, having a length L measured along a least square fitted straight line of the surface, with a resolution between about 5 nm and about 20 nm over the surface in consideration. The profile line can be divided into $L/\Delta x$ equal parts the value $|\Delta\Theta/\Delta x|$ can be calculated for every part. It can then be determined if the calculated value is higher than the desired threshold value or not. $L/\Delta x$ may be large enough in order to allow statistical analysis. Once microrough defects are identified using $|\Delta\Theta/\Delta x|$ values, it is possible to calculate the mean distance $d_m$ between two side-by-side microrough defects along the characteristic profile. To get the relative mean distance, the mean distance $d_m$ is can be divided by L (e.g., $\mu RN = d_m/L$), resulting in a value between 0 and 1. Higher values indicate a lower microroughness of the sample. Lower values indicate a higher microroughness of the sample. Those of skill in the art will appreciate other methods for measuring and estimating microroughness.

In one embodiment, the values of $\Theta$ can be determined from a cross-sectional profile of the sample with resolution between 5 nm and 20 nm, such as may be obtained using a cross-sectional transmission electron microscope.

The bulk of prior uses of AIC have used glass substrates. It is however not straightforward to extend this experience to ceramic substrates. The conditions are very different. Whereas glass substrates usually have a very flat surface (macroroughness below 10 nm and microflat), the ceramic substrates show a large macroroughness, ranging from 50 nm up to microns and are moreover microrough. This surface structure results from the sintering process which occurs during ceramic production. For example, the alumina substrates described herein had a peak to peak roughness of about 400 nm (RMS roughness ~80 nm). Moreover, ceramic consists at least in part of a crystalline phase, in contrast to the amorphous structure of glass.

In some embodiments, ceramic substrates are used with methods described herein. In some embodiments, the ceramic substrates have a high temperature resistance and have desirable thermal expansion, chemical stability, and optical properties. In various embodiments, the ceramic substrate is alumina (microcrystalline aluminium oxide) or mullite (mixture of $SiO_2$ and $Al_2O_3$). The polishing of mullite substrates leads to large open porosity (pores several microns deep and wide), which cannot be excluded with polishing (see e.g., FIG. 12, FIG. 13, and FIG. 14). The quality of the MIC film, e.g. AIC film, can be evaluated on the mullite material between these large pores.

In some embodiments, silicon layers on a substrate whose microroughness has been reduced is used to manufacture a solar cell. Any solar cell manufacturing techniques known in the art may be used.

EXAMPLES

Where alumina substrates were used, they were ADS996 substrates from CoorsTek. Double layers of aluminium and amorphous silicon were deposited one after the other, allowing the aluminium layer to get oxidized between the two depositions by a 2 min exposure to air. The aluminium deposition was done in an electron-beam, high-vacuum evaporator. The amorphous Silicon layer was either deposited in the same evaporator, or in a parallel plate plasma-enhanced CVD system from silane decomposition. A typical stack was 200 nm Al and 230-250 nm Si. These structures were then annealed in a tube furnace under nitrogen at 500° C. for a period of 30 min to 4 hours. During the annealing, crystalline silicon grains formed in the bottom layer while Al atoms move to the top surface, eventually resulting in a layer exchange. The top Al layer was then removed in a chemical solution containing phosphoric acid.

Example 1

AIC on Bare Ceramic Substrate 1a (Comparative Example)

The morphology of a typical sample obtained with the procedure described above can be seen in the SEM picture in FIG. 1. The AIC seed layer 2a as such is not clearly visible in this picture. The reason is that the layer 2a is covered by numerous 'islands' 3, the secondary crystallites formed within the top layer during the AIC process. Close observation with SEM and TEM analysis reveals that the grain size in the AIC seed layer 2a is around 1-2 µm. This grain size is substantially lower than reported results on glass. There appears to be much more nucleation taking place when the AIC is done on a ceramic substrate 1a, both in the bottom layer (leading to a small grain size) and in the top layer (leading to a high density of islands).

Example 2

Intermediate Layer Applied in Order to Reduce the Microroughness

Figure 2:
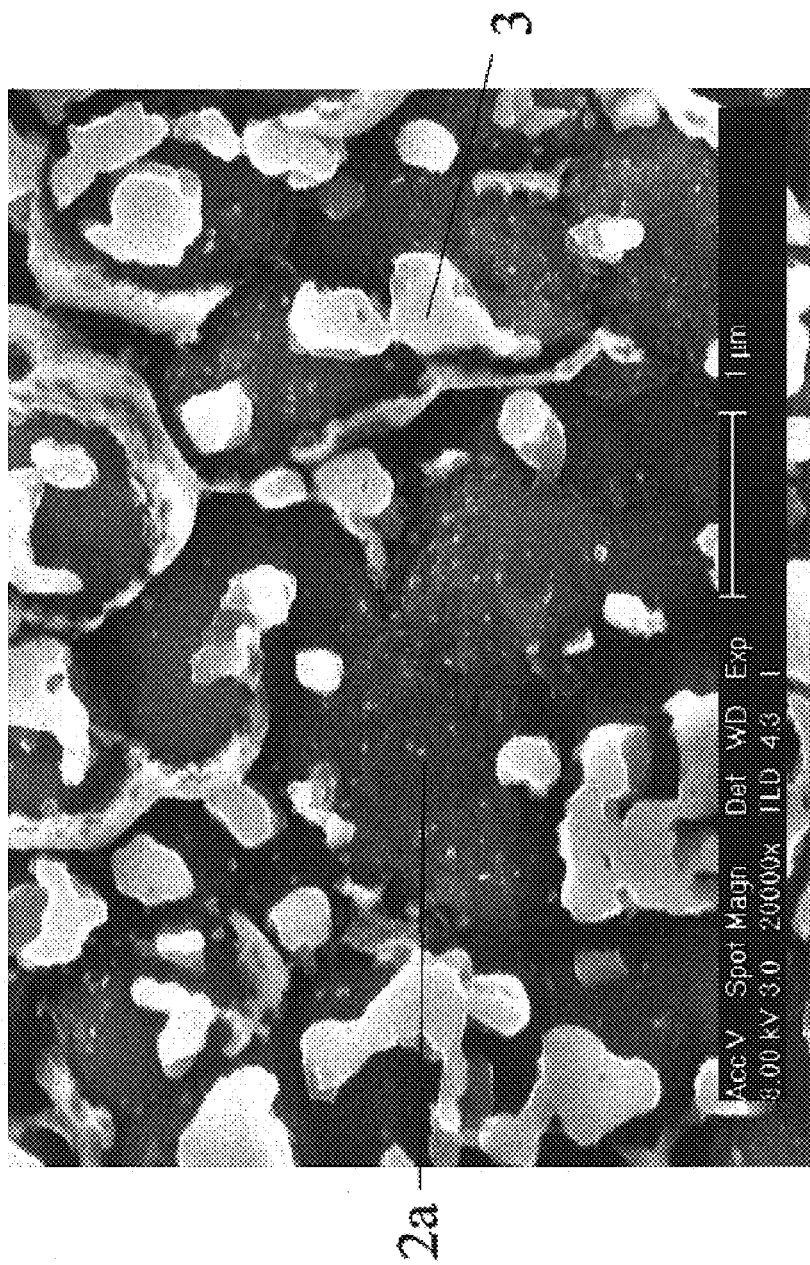
FIG. 2 is a SEM top view of an AIC layer formed on a ceramic substrate covered by pyrolithic oxide.
Figure 3:
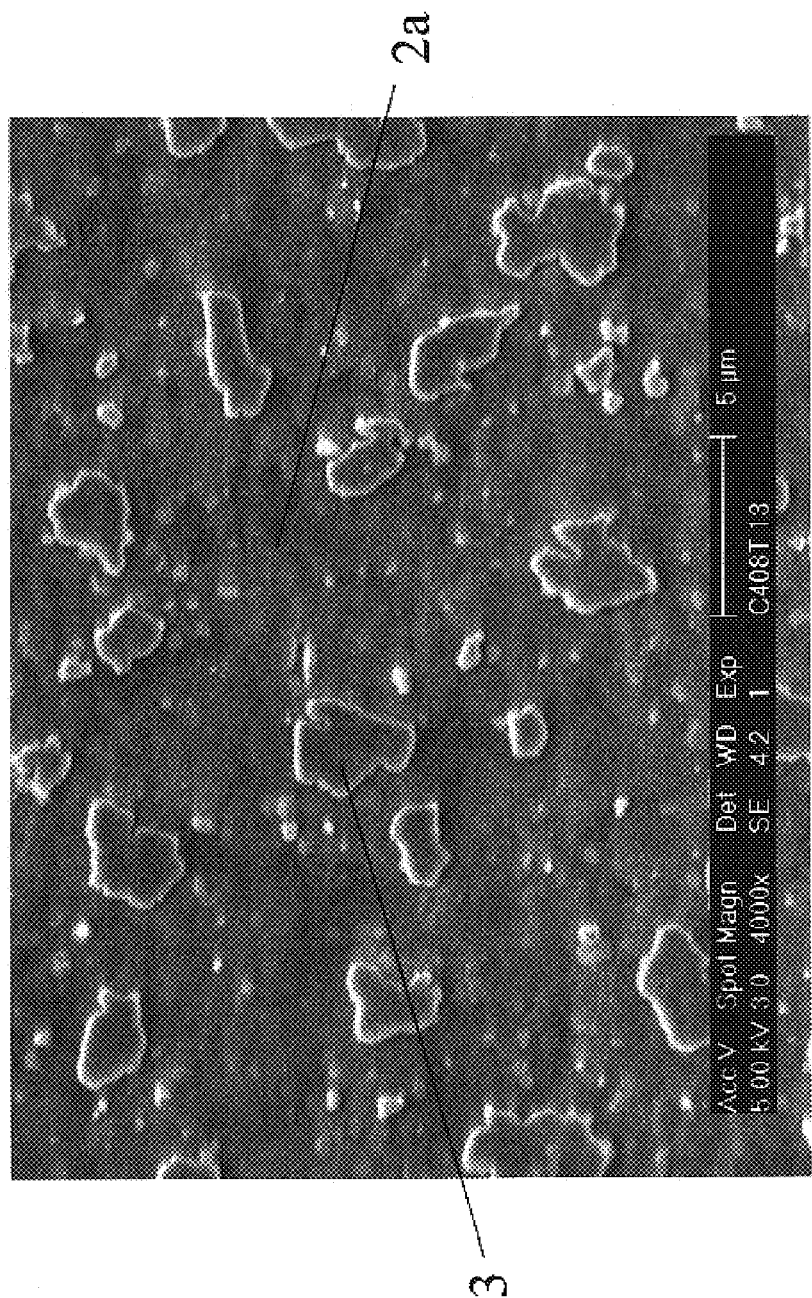
FIG. 3 is a SEM top view of an AIC layer formed on a ceramic substrate covered by a spin-on flowable oxide.
Figure 4:
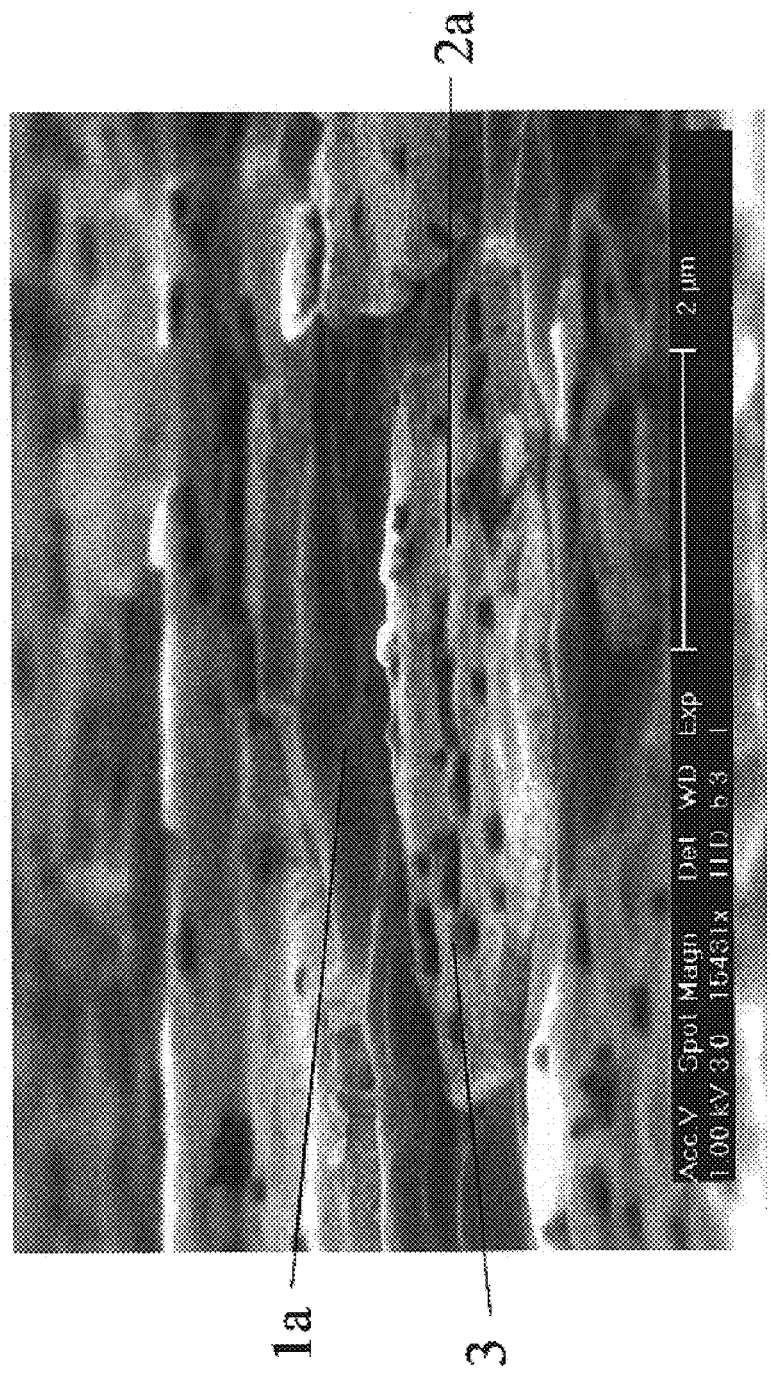
FIG. 4 is a SEM picture of a thin silicon grain formed by AIC on a spin-on oxide coated ceramic substrate.

An intermediate silicon oxide layer was introduced between the substrate 1a and the AIC layers. Two different types of oxide were used. One type was a pyrolithic oxide ('pyrox') deposited by the decomposition of silane at atmospheric pressure and 400° C. The second type was a spin-on flowable oxide (FOx-23 from Dow Corning), cured at 400° C. Pyrox was densified at 950° C. and the spin-on flowable oxide at 900° C. before the deposition of the AIC stack. SEM pictures of these samples are shown in FIG. 2 and FIG. 3, respectively. The density of islands 3 decreased significantly compared to Example 1, by about a factor two for the intermediate pyrox layer (FIG. 2), and another factor 2 for the spin-on oxide layer (FIG. 3). The appearance of the latter samples is however completely different. Because there are much less islands 3 in the case of the spin-on oxide, the structure of the main AIC seeding layer 2a is clearly visible and is in fact reminiscent of what is obtained on glass substrates. The layer 2a consists of roughly circular large grains (>5 µm), the growth of which is stopped by the encounter with a neighbouring grain. If the process is not allowed to proceed to full completion, or, as for these samples, the excess of Si is not sufficient, holes remain in the AIC seed layer 2a. The different features are even more evident in the tilted view of an AIC grain on a ceramic substrate 1a with intermediate spin-on oxide 1b as depicted in FIG. 4. One single large grain is seen in the centre of this picture, the surface of the substrate 1a being visible all around it. It is interesting to note that the surface of the substrate 1a is clearly not macroflat, but shows substantial waviness and thus RMS roughness. The peak to peak roughness is still larger than 100 nm. Nevertheless, the AIC grain growth proceeds along the substrate surface, resulting in a single grain. Without being bound to any particular theory, it is believed that this result is because the surface is microflat due to the spin-on oxide layer.

Although the SEM picture in FIG. 4 shows a not yet complete AIC seed layer 2a, it is relatively simple to achieve such a complete layer by tuning the properties of the AIC stack.

Example 3

Epitaxial Silicon Deposition

After removal of the metal layer obtained on top of the stack at the end of the MIC process, e.g. an Al layer in case of a AIC process, high temperature CVD was used to deposit an epitaxial layer on top of the seed layer 2a, an established technique common in the microelectronics processing. AIC seed layers 2a were prepared on spin-on flowable oxide 1b covering 5×5 $cm^2$ alumina samples 1a following the procedure described above. The conditions were such that the AIC layers 2a covered the complete surface. No attempt was made at removing the islands 3 from the seed layer 2a. Si layers 2b were deposited on these samples in a commercial single-wafer epitaxial reactor (Epsilon ASM) with trichlorosilane diluted in H2, at atmospheric pressure and at a temperature of 1130° C. The deposition rate was 1.4 µm/min. In situ doping with B was done by adding diborane to the gas flow, so as to form double layers with a 0.5-3 µm thick p+ region (~$10^{19}$ cm-3) and a 0.5-3 µm thick p region (variable doping).

Figure 5:
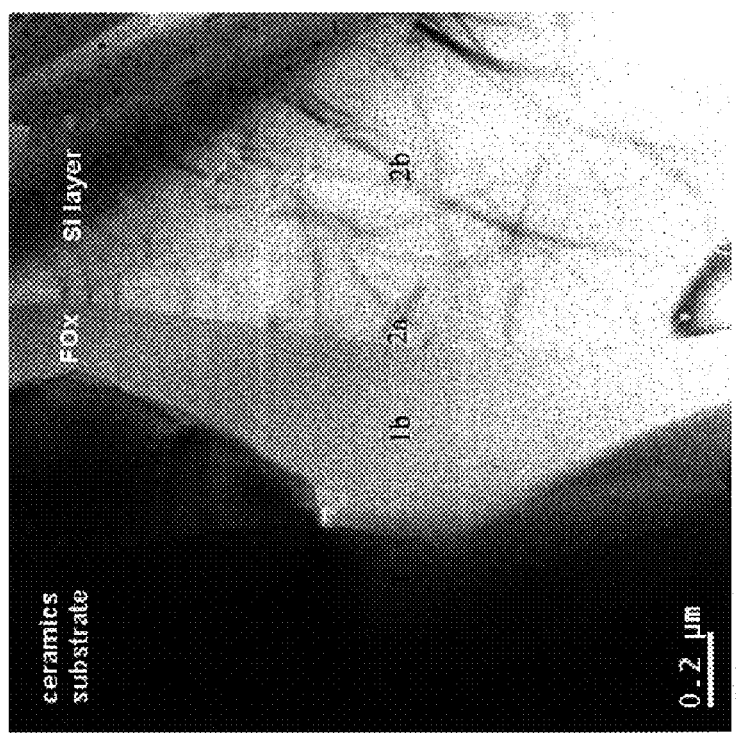
FIG. 5 is a TEM picture of a sample with structure ceramic/spin-on oxide/AIC/epitaxial layer.

A TEM cross-section of a sample with a structure comprising alumina ceramic 1a/spin-on flowable oxide 1b/AIC seed layer 2a/epitaxial layer 2b is shown in FIG. 5. The intermediate spin-on oxide 1b reduced the microroughness but did not completely flatten the substrate's surface. The quality of the epitaxial layer 2b appeared very good. The seed layer 2a could not be distinguished from the epitaxial layer 2b, no interface between the two regions being visible. The cross-sections show a very low defect density. The bent diffraction lines visible in FIG. 5 do indicate that there is substantial stress in the layer. No needle-like grains, (as would be expected as a result of epitaxy on islands 3) were observed.

Figure 6:
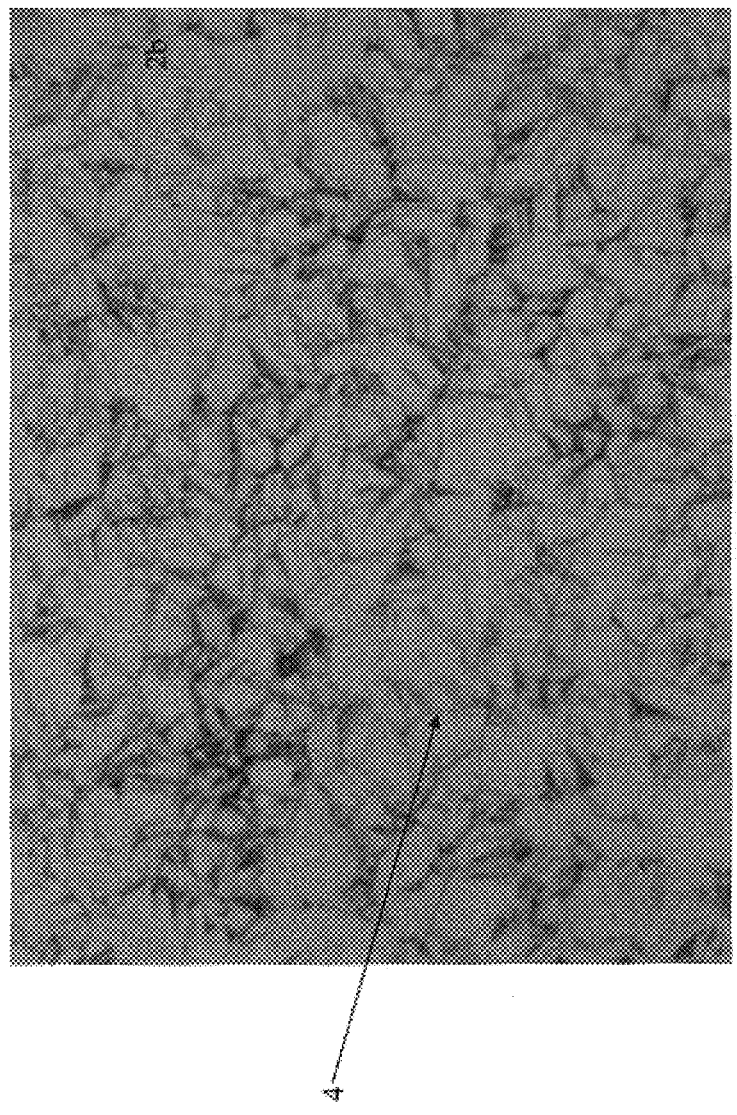
FIG. 6 is an optical microscope picture of an epi layer grown on an alumina ceramic/spin-on oxide/AIC seed layer sample, after polishing and Secco etch. SIMS measurements were carried out on such a sample. The dopant profile was as expected. The oxygen concentration was found to be constant throughout the layer at around $6 \times 10^{17}$ cm$^{-3}$.

To determine the grain size and observe the grain size distribution, the Si layer 2b of some of the samples were polished, a defect etch was applied and these planar sections were studied under an optical microscope (see FIG. 6). The nominal grain size as determined by the grain boundary 4 counting technique was about 5 μm, while some grains reach 10 μm diameter or even larger.

Example 4

Solar Cell Processing

Any standard solar cell manufacturing technique can be used to produce photovoltaic cells as solar cells from the structures obtained as described above. The present example was performed to illustrate the quality of the epitaxial layer 2b. From samples with the structure ceramic 1a/spin-on oxide 1b/AIC seeding layer 2a/epitaxial layer 2b, simple mesa cells were made (1×1 cm², base contact at the periphery of the cell) with the following process:
1. Emitter diffusion: P-diffusion from a P-doped pyrolithic oxide
2. Bulk and surface passivation: hydrogenation and nitride deposition in a PECVD system
3. Mesa etching: definition of the cell area (1 cm²) by photolithography and etching in a silicon etch solution
4. Side contact formation: shadow evaporation of Al and sintering
5. Emitter contact formation: photolithography, evaporation of a Ti/Pd/Ag stack and lift-off The mesa structure is useful for relatively fast experiments to assess the quality of the material, but has an intrinsic limitation. The majority carriers (holes) have to travel a large distance to reach the base contact at the periphery over a path with low conductance (e.g., the thin p+ layer). Therefore a high series resistance was expected.

Table 2 shows the illuminated IV parameters of these solar cells for various doping levels. Although the best efficiency with a diffusion emitter was 5.0%, with a Voc of 460 mV, the shunt resistance was not a problem, with Rsh above 1000 ohm cm² for all samples. The series resistance was, as expected, rather high, exceeding 3 ohm cm² for the best cell. The base doping level appears to have a minor impact on the cell parameters.

TABLE 2

| Nbase (cm$^{-3}$) | $J_{SC}$ (mA/cm²) | $V_{OC}$ (mV) | FF (%) | Eff. (%) |
| --- | --- | --- | --- | --- |
| 5'10$^{15}$ | 16.0 | 410 | 62.6 | 4.1 |
| 1'10$^{16}$ | 16.3 | 411 | 62.7 | 4.2 |
| 3'10$^{16}$ | 16.6 | 412 | 61.3 | 4.2 |
| 1'10$^{17}$ | 16.1 | 428 | 61.2 | 4.2 |

These results are the best reported on ceramic substrates for techniques where no silicon (re-)melting is involved. The Voc in the range 410-460 mV is dominated by recombination in the junction space charge region and indicates a low minority carrier lifetime. Using Taretto's formula for determination of the effective diffusion length from IV parameters [U. Rau K. Taretto, J. H. Werner, J. Appl Phys. 93 (2003) 5447, which is incorporated herein by reference in its entirety], a $L_{eff}$ of 1.3 μm was found. This result was based on some assumptions about not well-known material parameters (e.g. electron mobility), but clearly indicates that the diffusion length is at present substantially lower than the active layer thickness.

Example 5

Comparison Experiments

Additional experiments were performed to compare the results obtained with and without lower the substrate microroughness. The samples prepared are listed in Table 3.

TABLE 3

Figure 7:
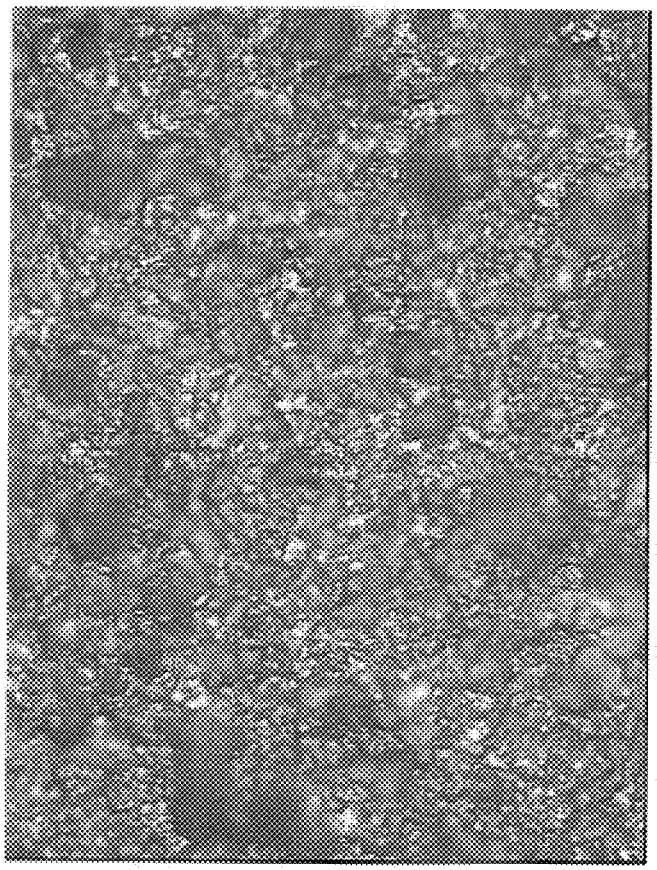
FIG. 7 shows sample 4: non-polished mullite/AIC
Figure 8B:
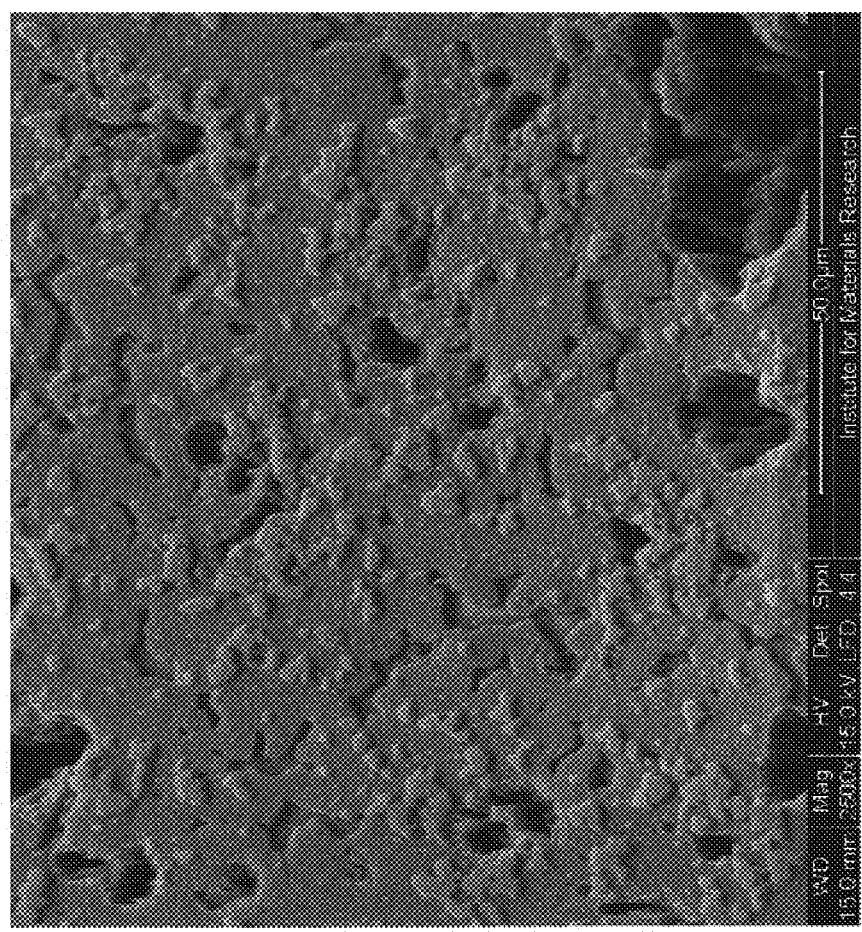
FIG. 8b is a SEM image of sample 1
Figure 9:
FIG. 9 shows sample 8: non-polished mullite/spin-on oxide/AIC
Figure 10A:
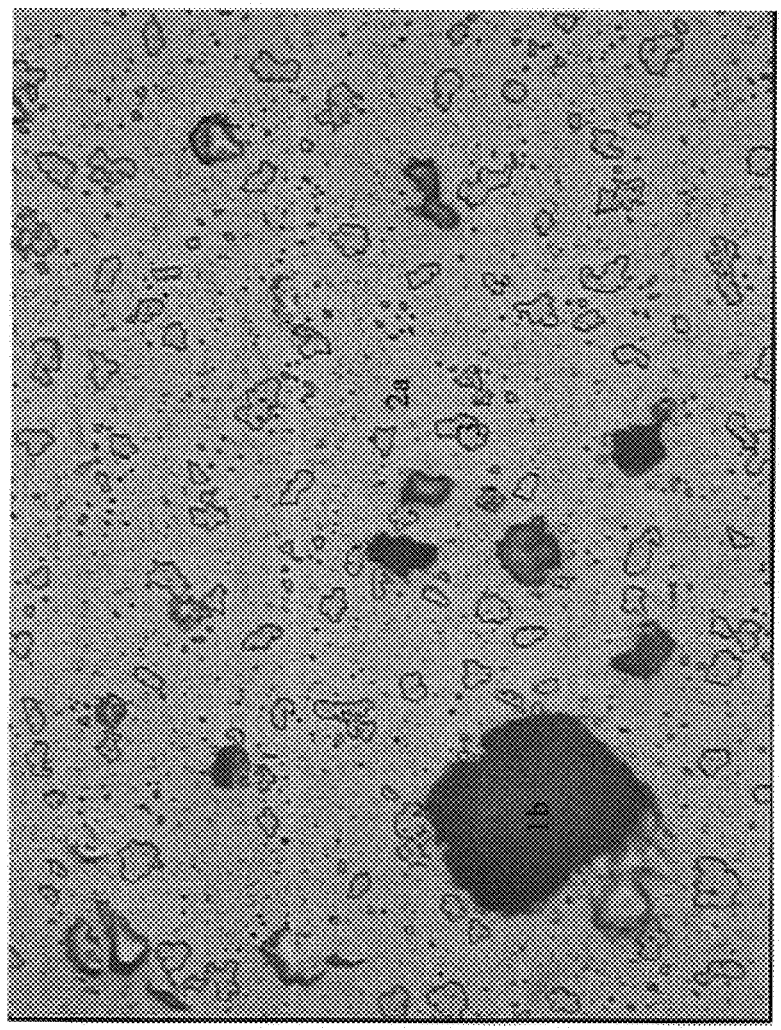
FIG. 10a shows sample 5: polished mullite/spin-on oxide/AIC

| Samples | Substrate | Oxide layer | AIC layer |
| --- | --- | --- | --- |
| 1, FIG. 8a | mullite polished | No | 200 nm Al 230 nm Si |
| 4, FIG. 7 | mullite not polished | No | 200 nm Al 230 nm Si |
| 5, FIG. 10a | mullite polished | Flowable Oxide (Fox) | 200 nm Al 230 nm Si |
| 8, FIG. 9 | mullite not polished | Fox | 200 nm Al 230 nm Si |
| 9, FIG. 11a | Alumina | Fox | 200 nm Al 230 nm Si |

All pictures shown in the respective figures were taken with an optical microscope with the same magnification. The long side of the picture corresponds to a distance of 127 μm and the short side to a distance of 95.5 μm.

Figure 12:
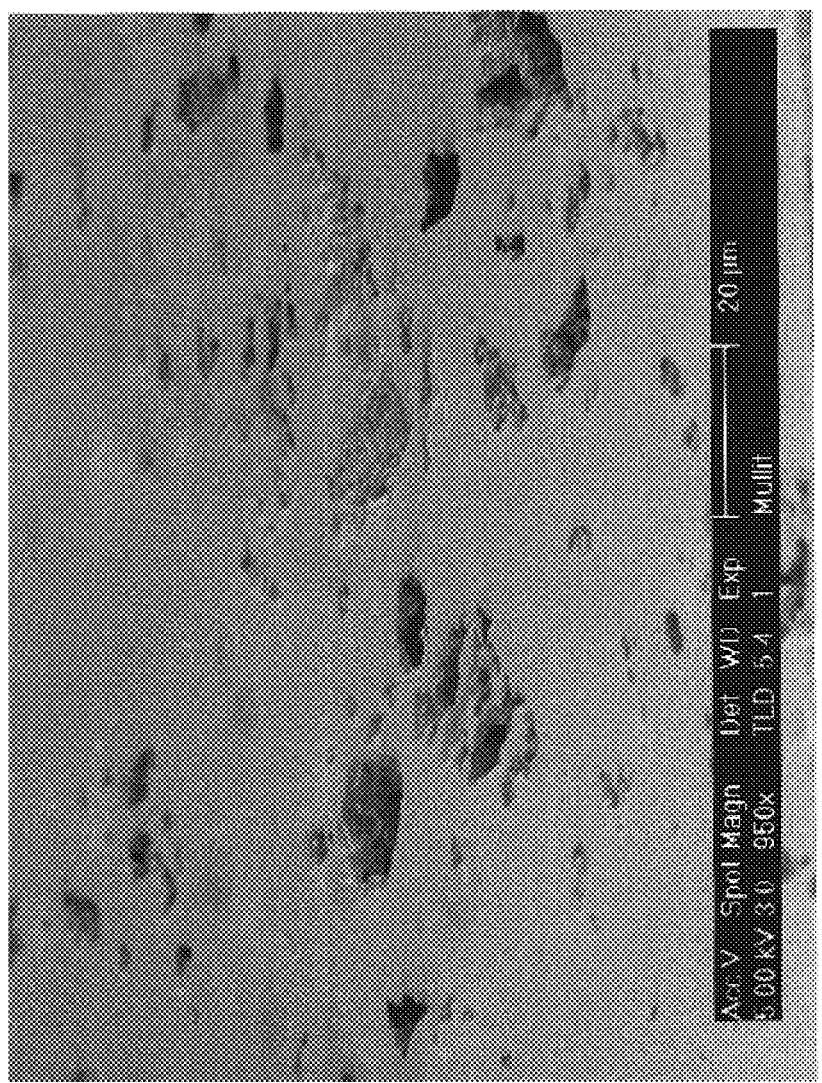
FIG. 12 is a SEM tilted view of a polished mullite sample
Figure 13:
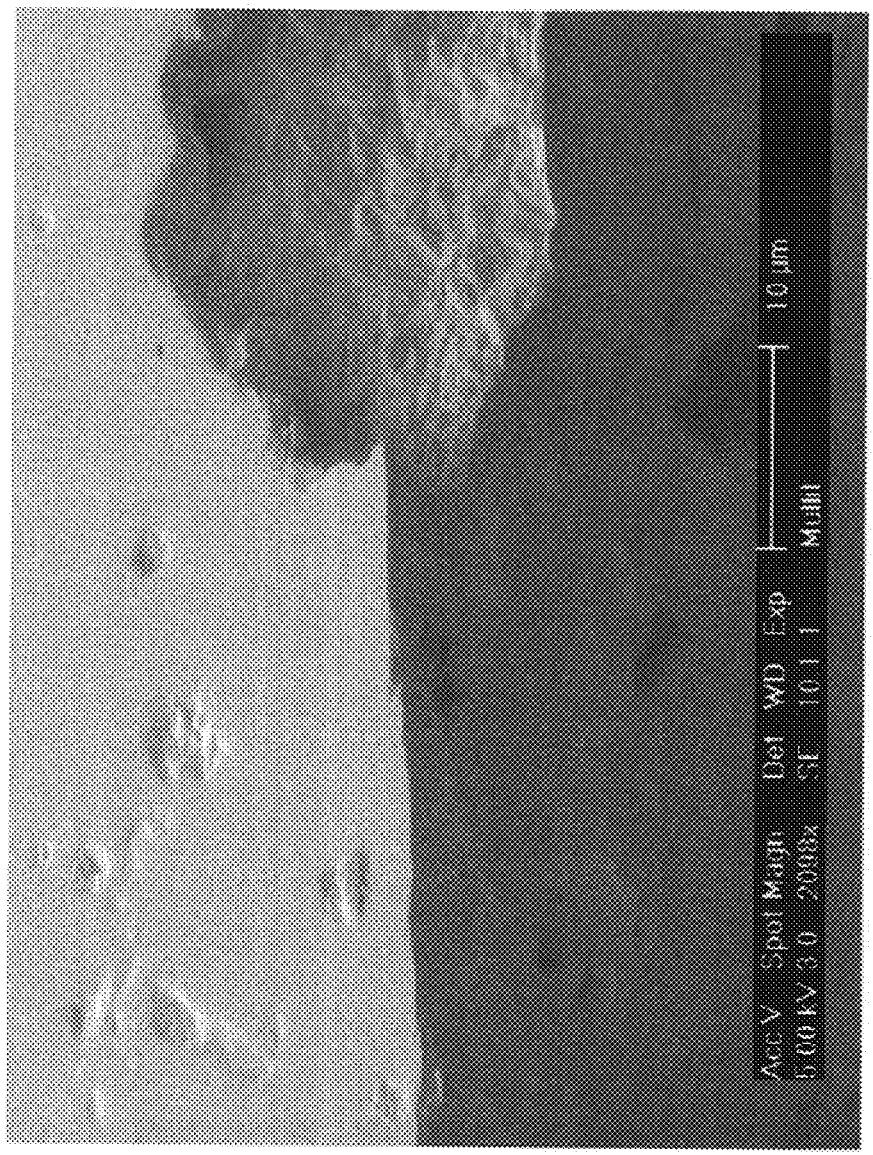
FIG. 13 is a SEM tilted cross section of a polished mullite sample
Figure 14:
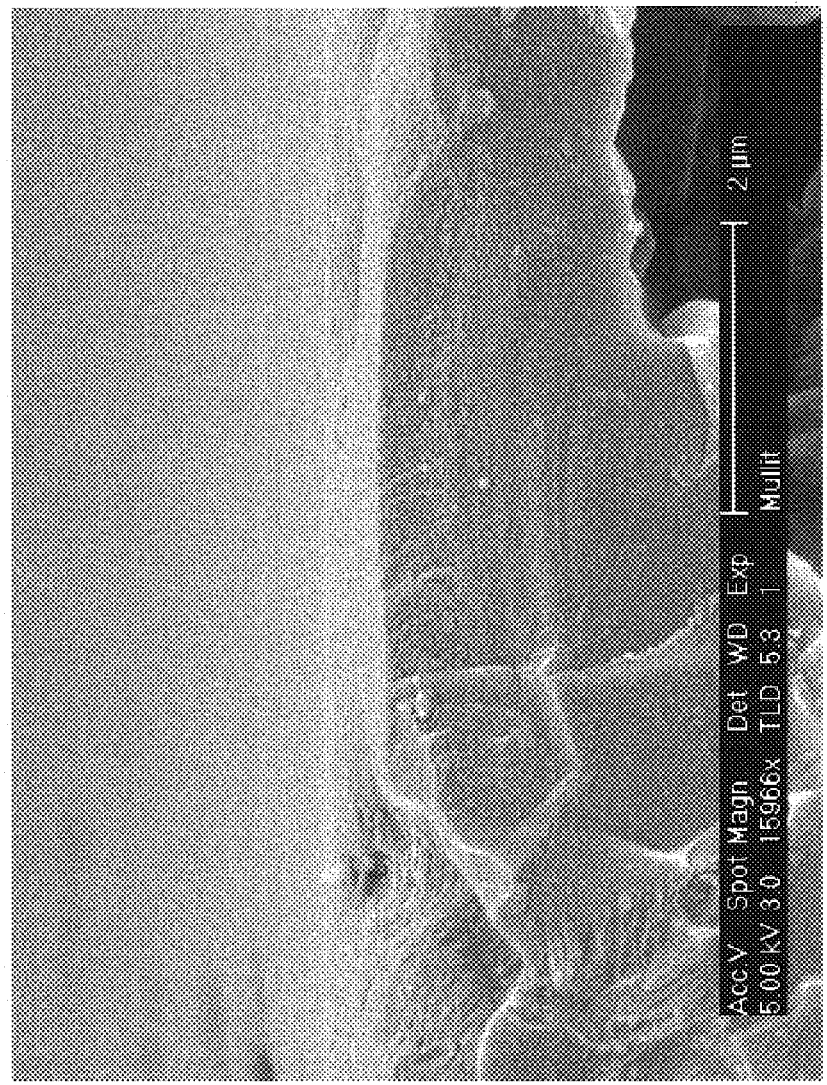
FIG. 14 is a SEM cross-section of a polished mullite sample

The ceramic substrates used in these experiments were commercial mullite substrates. The polishing of these substrates led to large open porosity (pores several microns deep and wide), as illustrated in FIG. 12, FIG. 13 and FIG. 14. Therefore, the quality of the AIC film was evaluated on the material between these large pores.

1. Comparison MIC Directly on Polished and Non-Polished Substrates (No Intermediate Micro Flattening Layer, e.g. Spin-On Oxide, Being Applied)

Figure 24:
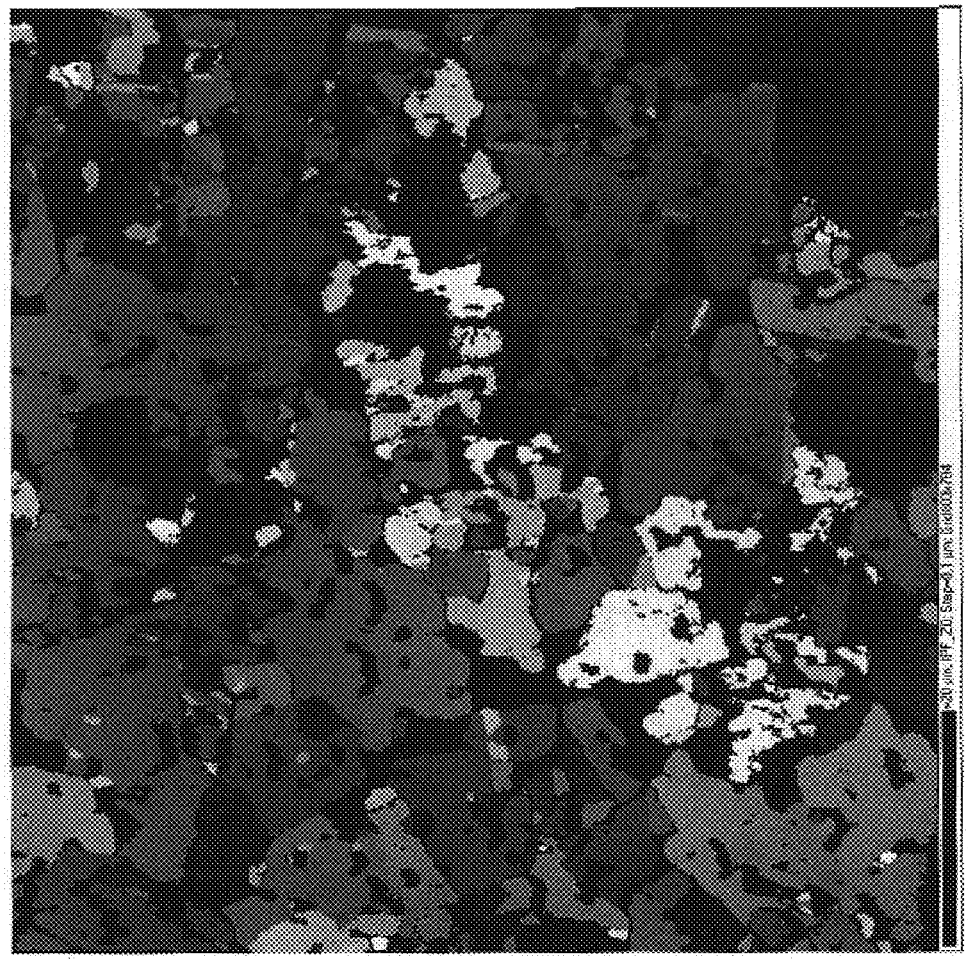
FIG. 24 EBSD map of a sample, polished mullite with AIC seed layer.

Sample 4: non-polished mullite/AIC (illustrated in FIG. 7)
Sample 1: polished mullite/AIC (illustrated in FIG. 8a and FIG. 24 (EBSD map))

Sample 1 was superior to sample 4, indicating that better results are obtained when the AIC is applied onto a polished substrate compared to a non-polished substrate. Sample 4 (FIG. 7) was much more rough than sample 1 (FIG. 8a). It was possible to see the Si seeding layer 2a in sample 1 and the islands 3 have sharp contours. In contrast, the seeding layer 2a and the islands 3 cannot easily be identified in sample 4. From the EBSD map of sample 1 (FIG. 24), it was derived that the maximum diameter of the grains is about 17.9 microns. Doing the MIC process on a polished ceramic substrate 1a lead to larger grain sizes and less islands 3 than on a non-polished ceramic substrate.

2. Comparison MIC on Non-Polished Substrates With and Without Micro Flattening Layer, e.g. Spin-On Oxide Sample 4: non-polished mullite/AIC (illustrated in FIG. 7)
Sample 8: non-polished mullite/sp-on ox/AIC (illustrated in FIG. 9)

Sample 8 (FIG. 9) was superior to sample 4 (FIG. 7), indicating that better results are obtained when AIC is applied onto a non-polished substrate with a flattening layer than onto a non-polished substrate without flattening layer. Sample 4 (FIG. 7) was more rough than sample 8 (FIG. 9). It was possible to see the Si seeding layer 2a and islands 3 in sample 8. In contrast, the seeding layer 2a and the islands 3 cannot easily be identified in sample 4.

Figure 11B:
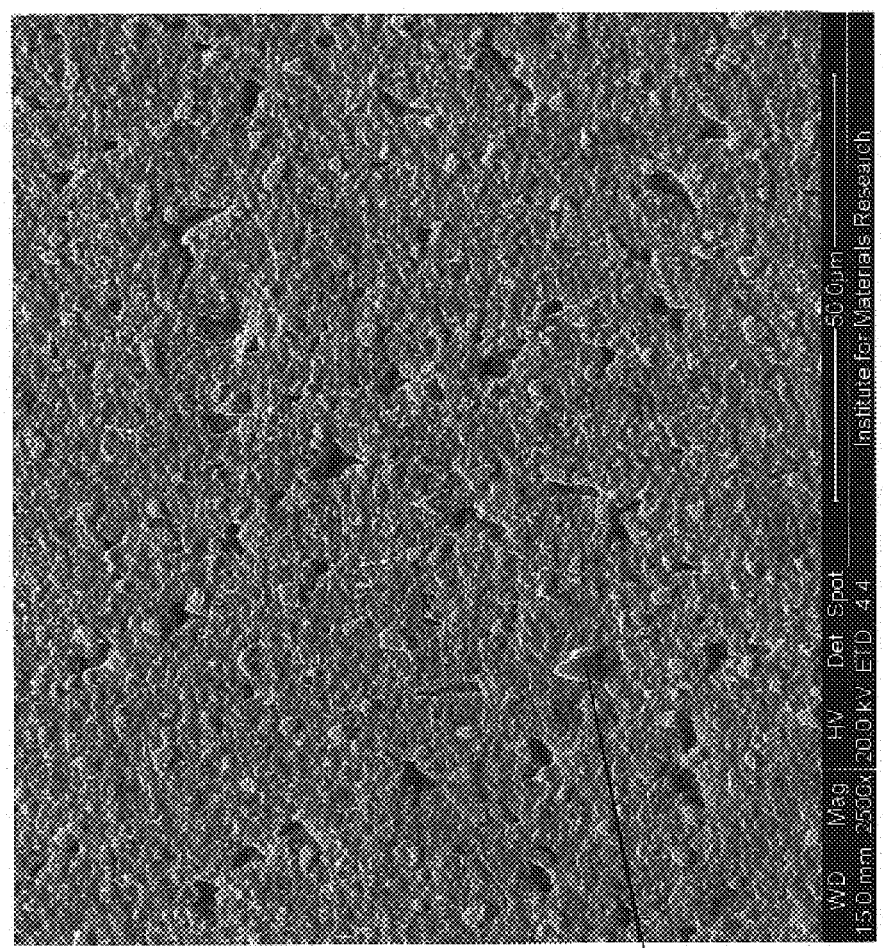
FIG. 11b is a SEM image of an alumina/spin-on oxide/AIC sample
Figure 22:
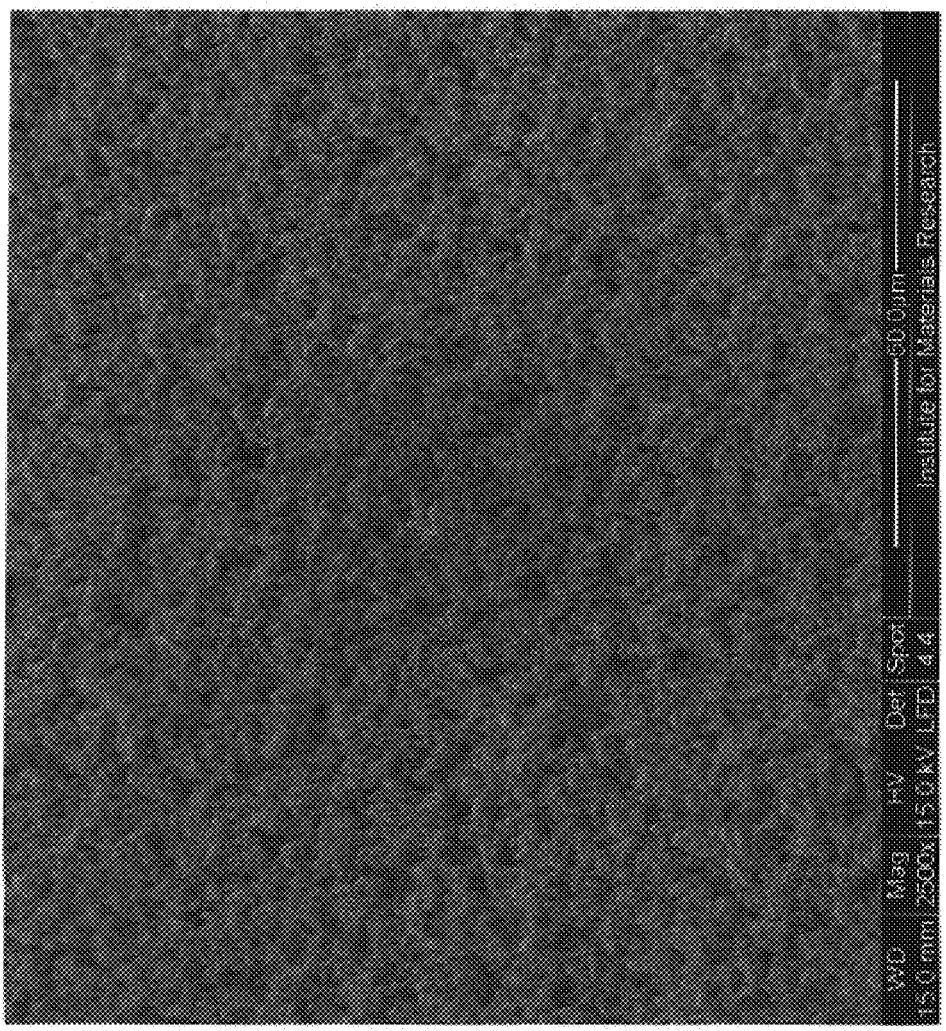
FIG. 22 SEM image of a sample alumina (without spin-on oxide) with AIC. An EBSD map was only possible on 0.3% of the total surface of this sample, resulting in substantially uniform black picture, linked to the roughness of the sample.

FIGS. 1 and 22 depict the SEM of an alumina/AIC sample and FIGS. 3 and 11b depict the SEM of an alumina/spin-on oxide/AIC sample. The alumina/spin-on oxide/AIC sample was superior to the alumina/AIC sample, again indicating that it is better to apply AIC onto a non-polished substrate with a flattening layer than onto a non-polished substrate without flattening layer. The sample depicted in FIG. 1 was more microrough than the sample in FIG. 3. Furthermore, the sample in FIG. 1 had significantly more islands 3 than the sample in FIG. 3.

Therefore, using a micro flattening layer, e.g. spin-on oxide, leads to a substantial improvement of the MIC layer (larger grains, less islands) compared to the case without micro flattening layer.

3. Comparison MIC on Polished Substrates With and Without Micro Flattening Layer, e.g. Spin-On Oxide Sample 1: polished mullite/AIC (illustrated in FIG. 8a and FIG. 24 (EBSD map))

Figure 25:
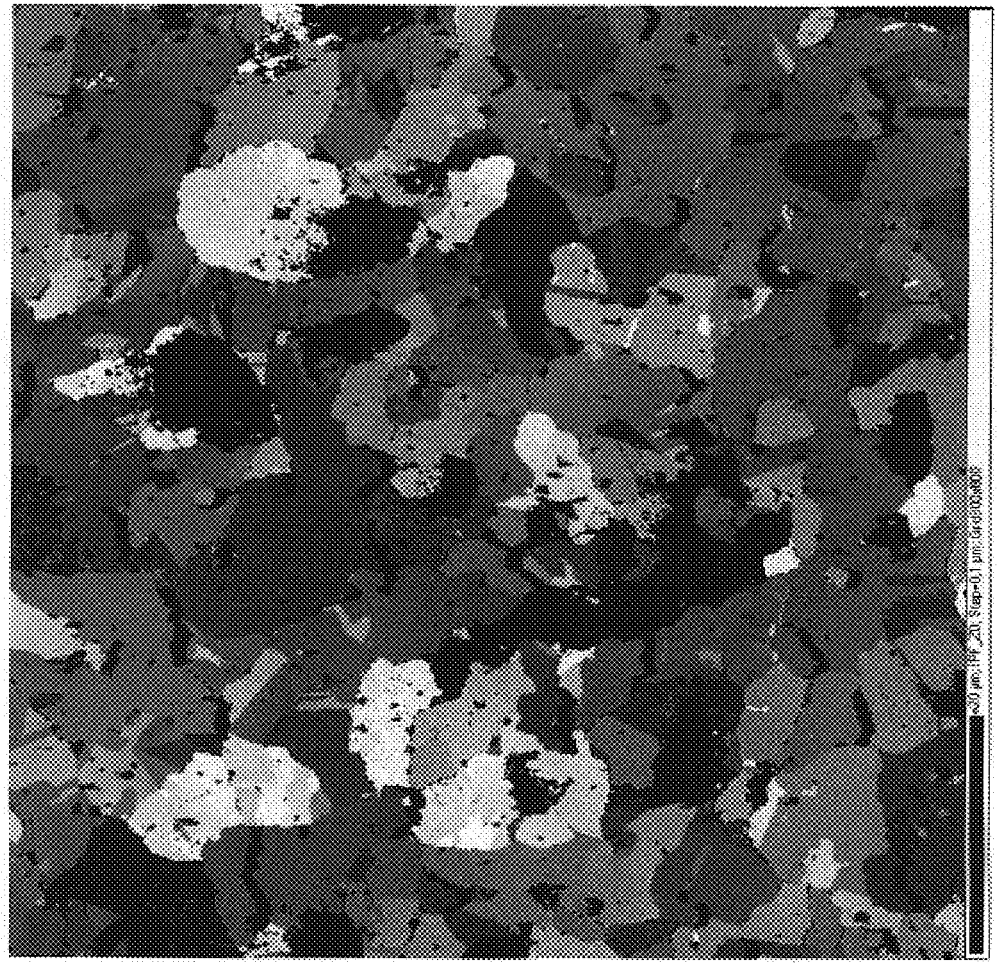
FIG. 25 EBSD map of sample of polished mullite with spin-on oxide and AIC seed layer.

Sample 5: polished mullite/spin-on oxide/AIC (illustrated in FIG. 10a and FIG. 25 (EBSD map))

From an electron backscattering diffraction (EBSD) map of sample 1 (FIG. 24), the maximum diameter of the grains were found to be 17.9 µm. FIG. 8b is a SEM image of the sample, where it was possible to see the holes in the Si seed layer and the islands 3 on top of the Si seed layer. Besides the holes in the seeding layer there were also holes in the substrate, as no flattening layer was applied to fill those holes.

Figure 10B:
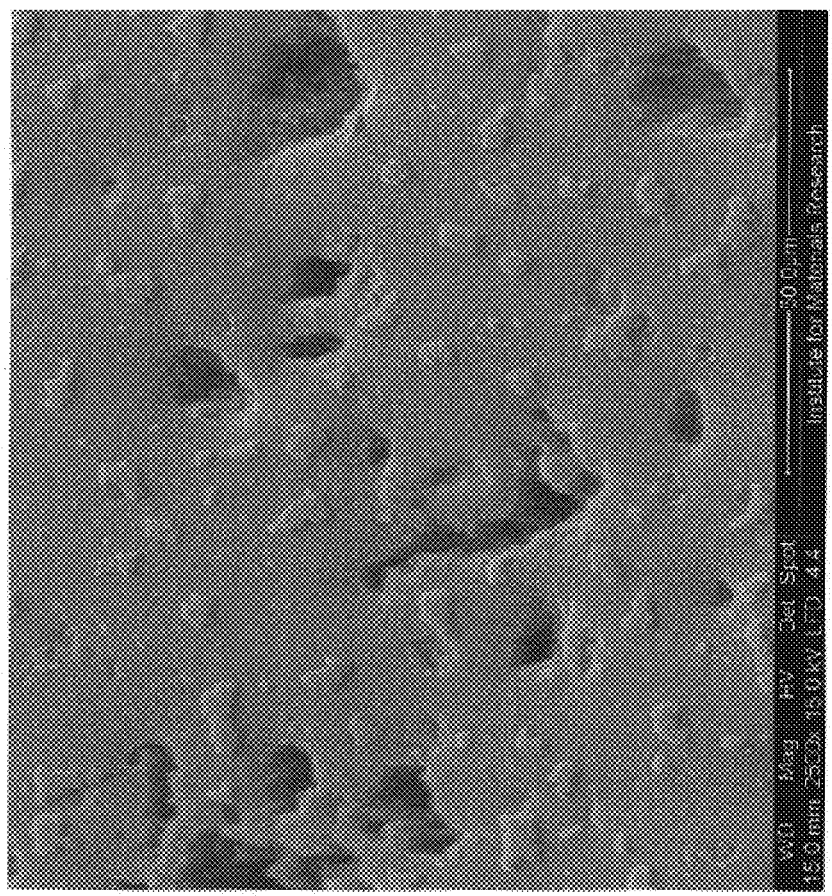
FIG. 10b is a SEM image of sample 5: polished mullite/spin-on oxide/AIC

From an electron backscattering diffraction (EBSD) map of sample 5 (FIG. 25), the maximum diameter of the grains was found to be 17.1 µm. FIG. 10b is a SEM image of the sample. The density of holes and islands was decreased in comparison with sample 1. The big holes in the substrate were still present; the flattening layer used did not completely fill these holes.

When comparing both polished mullite samples, it can be seen that the use of a flattening layer decreased the density of islands (positive effect), the use of a flattening layer decreased the density of holes in the seeding layer (good effect), and there was not a big difference in grain size between both, using a flattening layer gives a slightly higher average grain size.

Without being bound by any particular theory, a possible explanation could be as follows: mullite is microflat and macroflat on some areas due to polishing. The flattening layer reduces the number of areas still having microroughness, which results in better seed layers, with less holes and islands. Because polished mullite per se is already microflat and macroflat on many areas of the substrate, the influence of the flattening layer is less than with alumina (see below).

Sample 5 was superior to sample 1, indicating that a better result was obtained when applying AIC onto a polished substrate with micro flattening layer than to apply it onto a polished substrate without micro flattening layer. Sample 5 had less islands 3 and sa maller cover of islands than sample 1. Sample 5 also had less holes (is more continuous) than sample 1.

Using a micro flattening layer, e.g. spin-on oxide, led to a substantial improvement of the MIC layer (larger grains, less islands) compared to the case without a micro flattening layer, and this for both polished and unpolished substrates. There therefore appears to be a beneficial effect from using a micro flattening layer before applying MIC, e.g. AIC.

TEM pictures also demonstrated the increased grain size when using a flattening layer, e.g. spin-on oxide.

4. Comparison MIC on Mullite and Alumina Substrates with Micro Flattening Layer, e.g. Spin-On Oxide Sample 5: polished mullite/spin-on oxide/AIC (illustrated in FIG. 10a and FIG. 10b (SEM))

Sample 9: alumina/FOx/poly Si (illustrated in FIG. 11a, FIGS. 11b (SEM), and 23 (EBSD))

Figure 23:
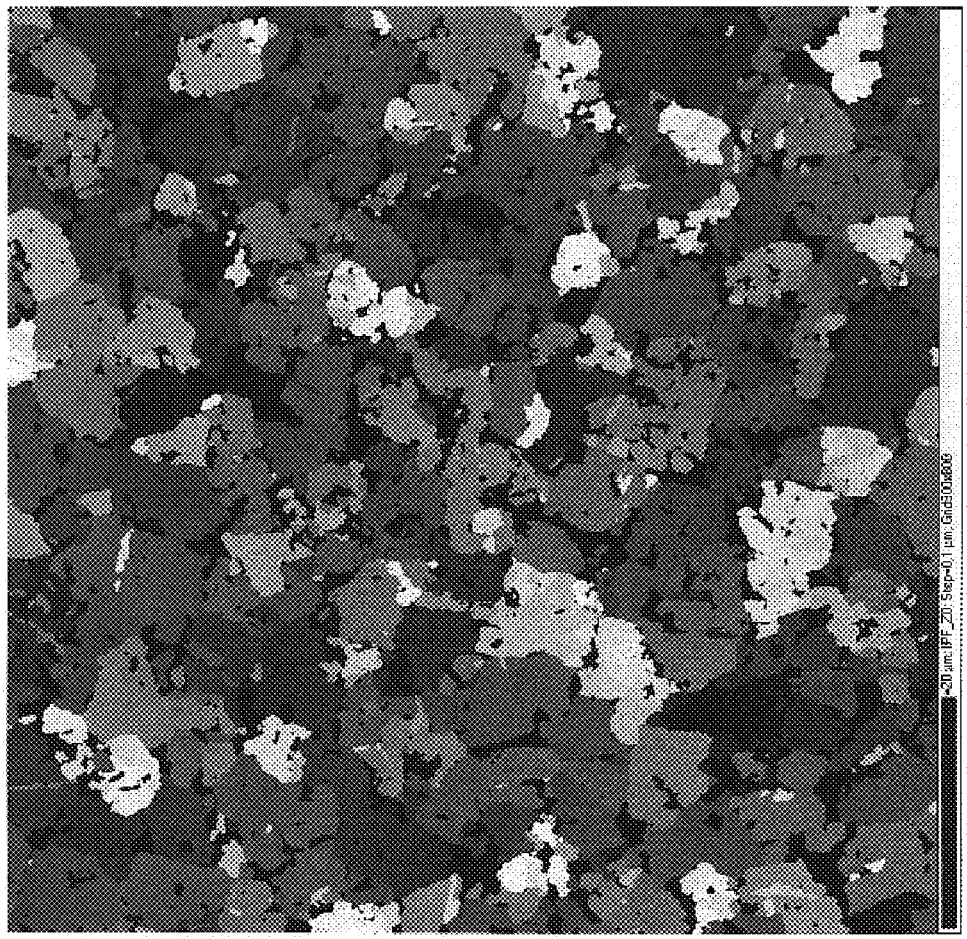
FIG. 23 EBSD map of a sample alumina with spin-on oxide and AIC.

From an electron backscattering diffraction (EBSD, see FIG. 23) map of sample 9, the maximum diameter of the grains was found to be 11.8 µm. Grains with a diameter larger than 5 µm covered 80% of the area. FIG. 11b is a SEM image of the sample, where it was possible to see the holes in the poly Si layer and the islands 3 on top of the poly Si layer.

An EBSD pattern is related to grain orientation. At places where holes and islands are located is not always possible to determine the orientation due to partly shadowing of the EBSD patterns. For the above sample it was possible to determine the orientation on 86.1% of the surface. Corresponding EBSD measurement on alumina samples without FOx gave only orientation data on 0.3% of the surface, which shows that the surface, where there are a lot of islands, is too rough.

Comparing this result to the results for sample 5 already given above (maximum diameter of the grains 17.1 µm) shows bigger grain size between the open porosities on mullite sample than on alumina samples. Polished mullite are from the beginning less rough than alumina, which results in a bigger difference between sample with and without spin-on oxide for alumina than mullite. For both types of samples with spin-on oxide, mullite gave slightly better results than alumina.

The above description indicates that by providing a surface with reduced or substantially no microroughness, a much better MIC, e.g. AIC, seed layer can be obtained.

Example 6

Double Flattening (Both Micro and Macro Roughness)

Figure 16:
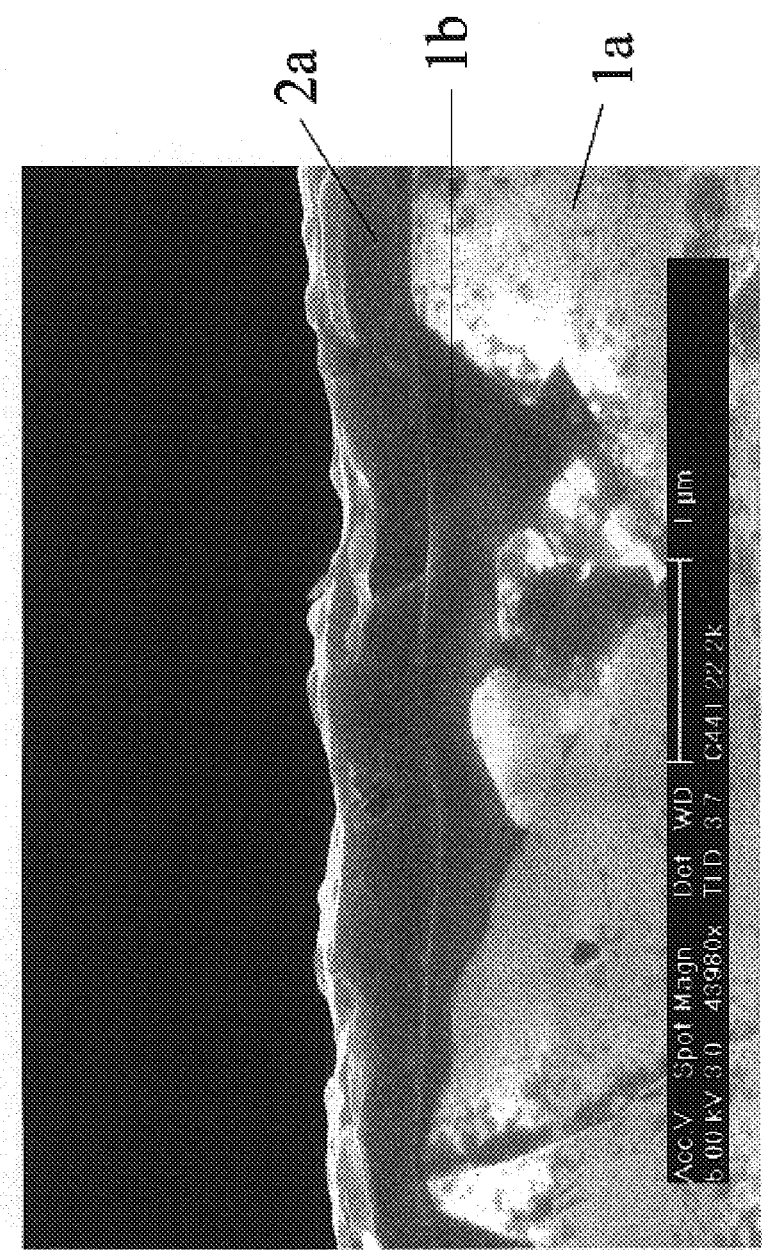
FIG. 16 is a cross-sectional view of a sample ceramic/spin-on oxide/AIC layer. The spin-on oxide layer was thinner compared to the other samples with a spin-on oxide layer (except for that shown in FIG. 18, which is from the same sample).
Figure 17:
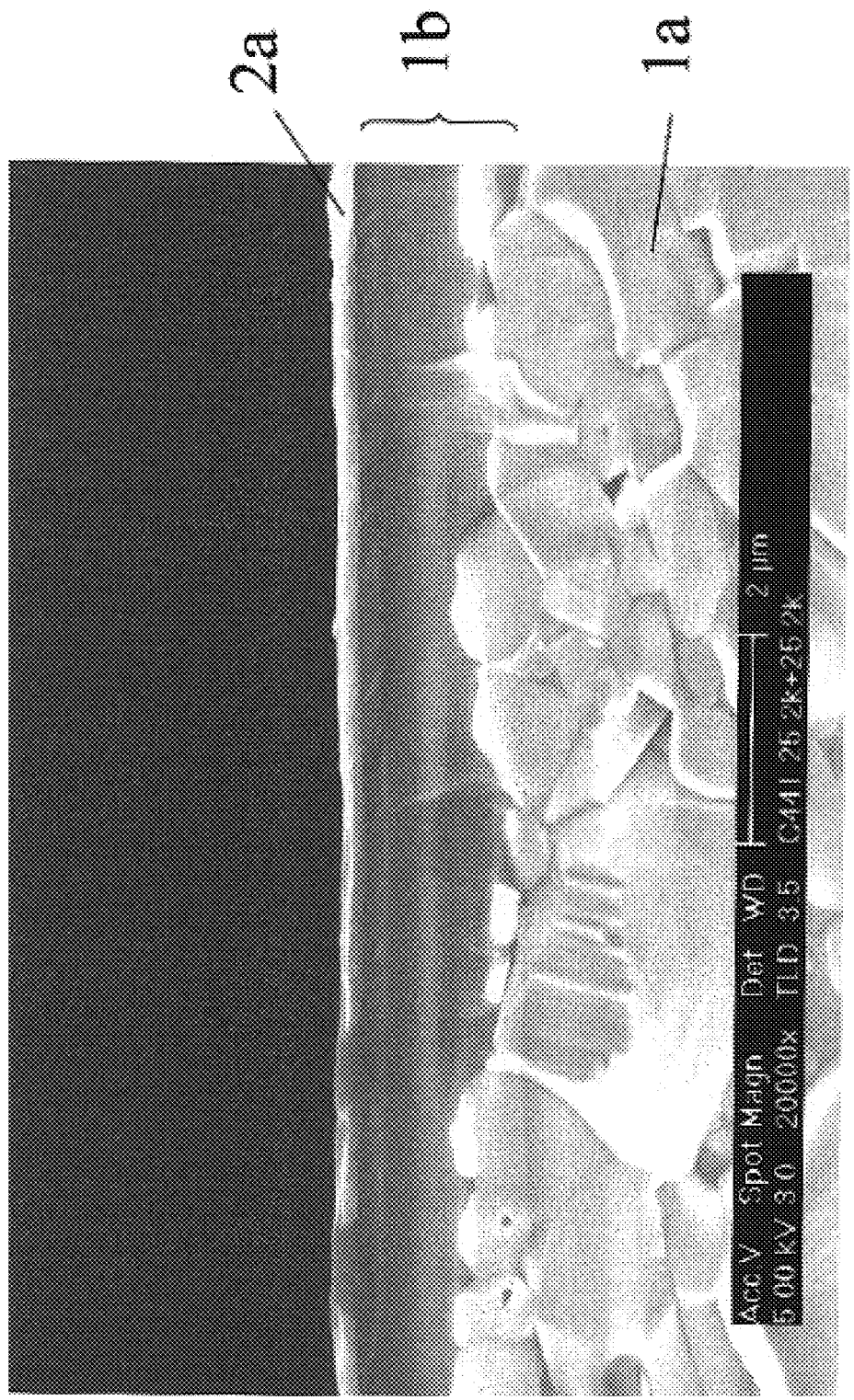
FIG. 17 is a cross-sectional view of a sample ceramic/spin-on oxide/AIC layer with double spin-on oxide layer.

It was found that by also removing the macroroughness the MIC, e.g. AIC, process is further improved, though the improvement is less than when going from a microrough to a microflat surface. Obtaining a macroflat surface can for instance be achieved by twice spinning a flowable oxide over a surface. This result can be seen from FIG. 16 compared to FIG. 17, the first one showing a cross-section of a sample ceramic 1a/spin-on oxide 1b/AIC layer 2a, and the second one showing a cross-section of a sample ceramic 1a/spin-on oxide 1b/AIC layer 2a, with double spin-on oxide layer. In the case of FIG. 17, the spin-on oxide layer 1b/AIC layer 2a interface is both micro- and macroflat.

Figure 18:
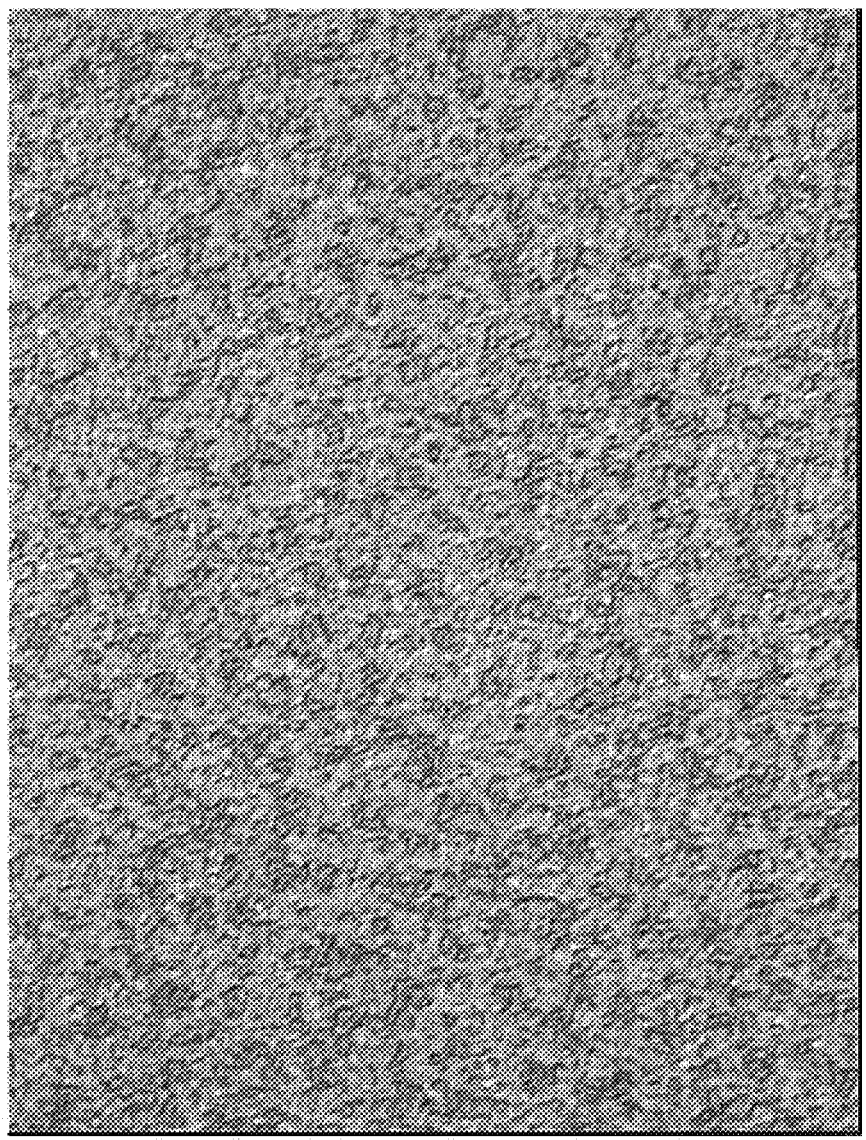
FIG. 18 is a top view optical microscope picture of a sample ceramic/spin-on oxide/AIC layer after aluminium removal (127×95.5 μm$^2$). The spin-on oxide layer was thinner compared to the other samples with a spin-on oxide layer (except for that shown in FIG. 16, which is from the same sample).
Figure 20:
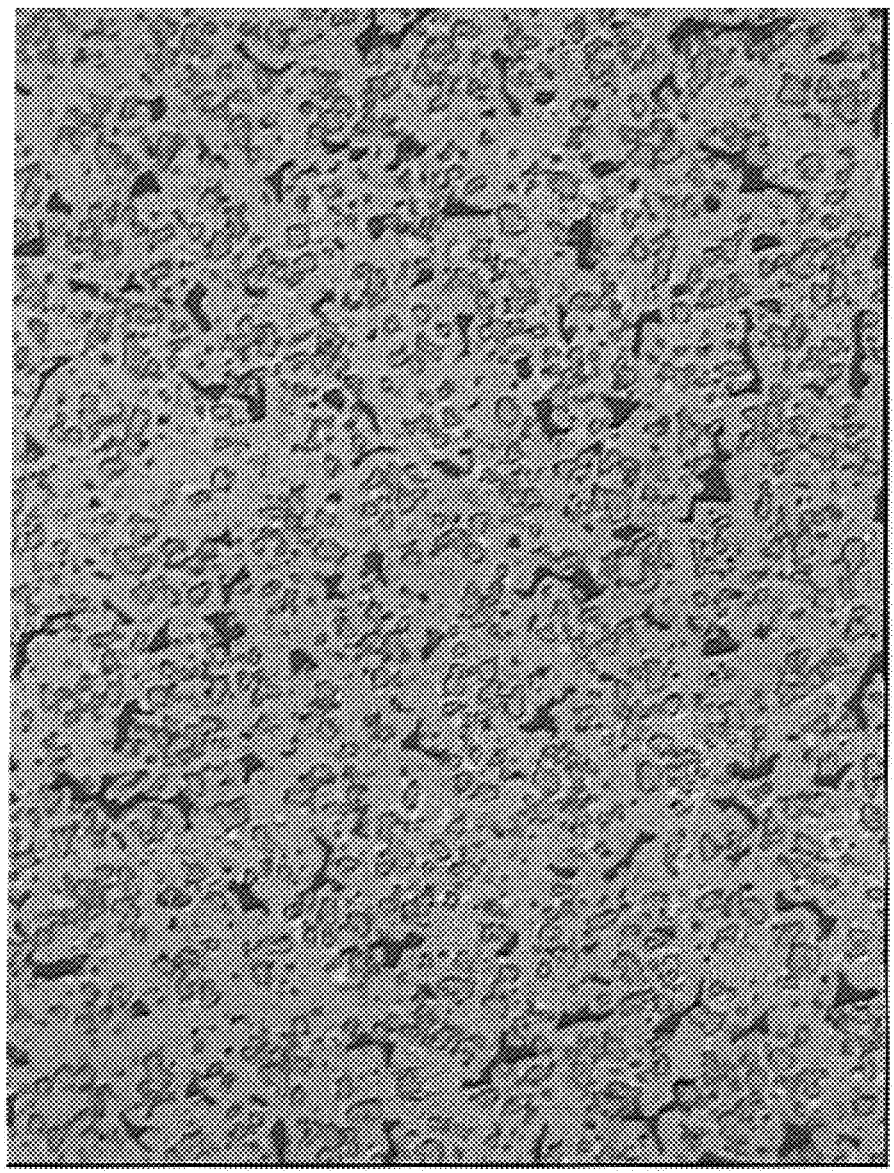
FIG. 20 is a top view optical microscope picture of a sample ceramic/spin-on oxide/AIC layer with double spin-on oxidelayer after Aluminium removal (127×95.5 μm$^2$).

FIG. 18 and FIG. 20 show top view optical microscope pictures of sample ceramic 1a/spin-on oxide 1b/AIC layer 2a after aluminium removal. In the case of FIG. 18, the spin-on oxide layer 1b consists of a single layer. In the case of FIG. 20, the spin-on oxide layer 1b consists of a double spin-on oxide layer. It can be seen that in the double spin-on oxide layer, a flatter seed layer is obtained than in the single spin-on oxide layer. The AIC layer in FIG. 18 has a decreased quality compared with FIG. 11a (both alumina/spin-on oxide/AIC), because the spin-on oxide layer was thinner (more macroroughness).

Figure 19:
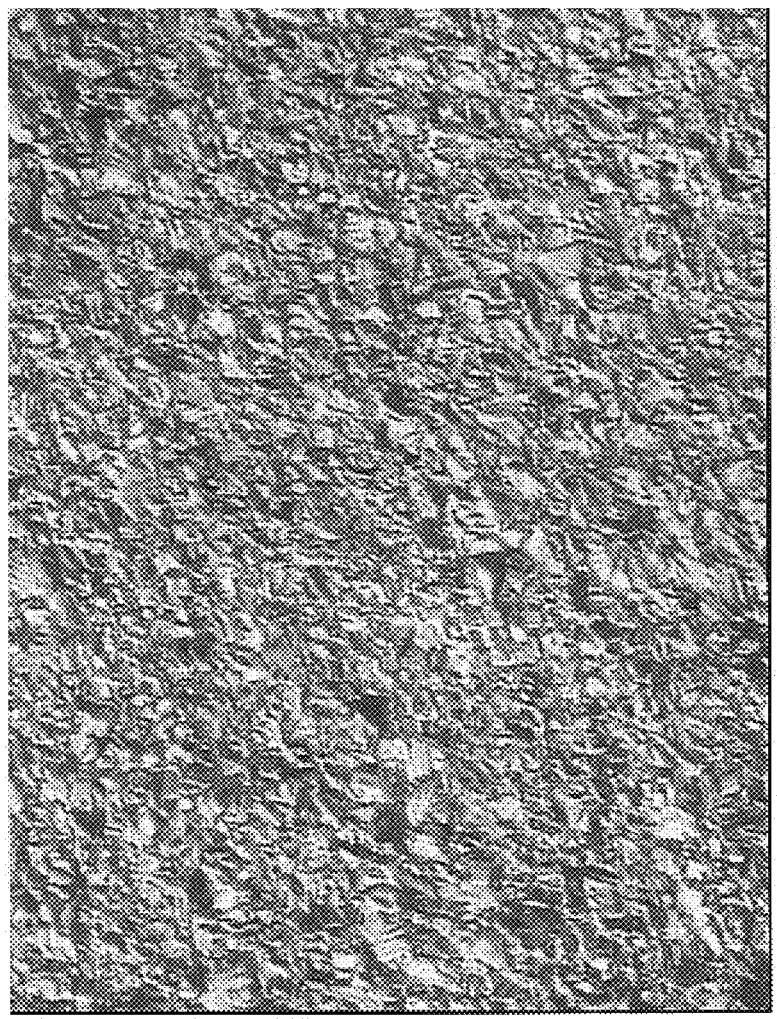
FIG. 19 is a top view optical microscope picture of a sample ceramic/spin-on oxide/AIC layer after epitaxial growth (127×95.5 μm$^2$).
Figure 21:
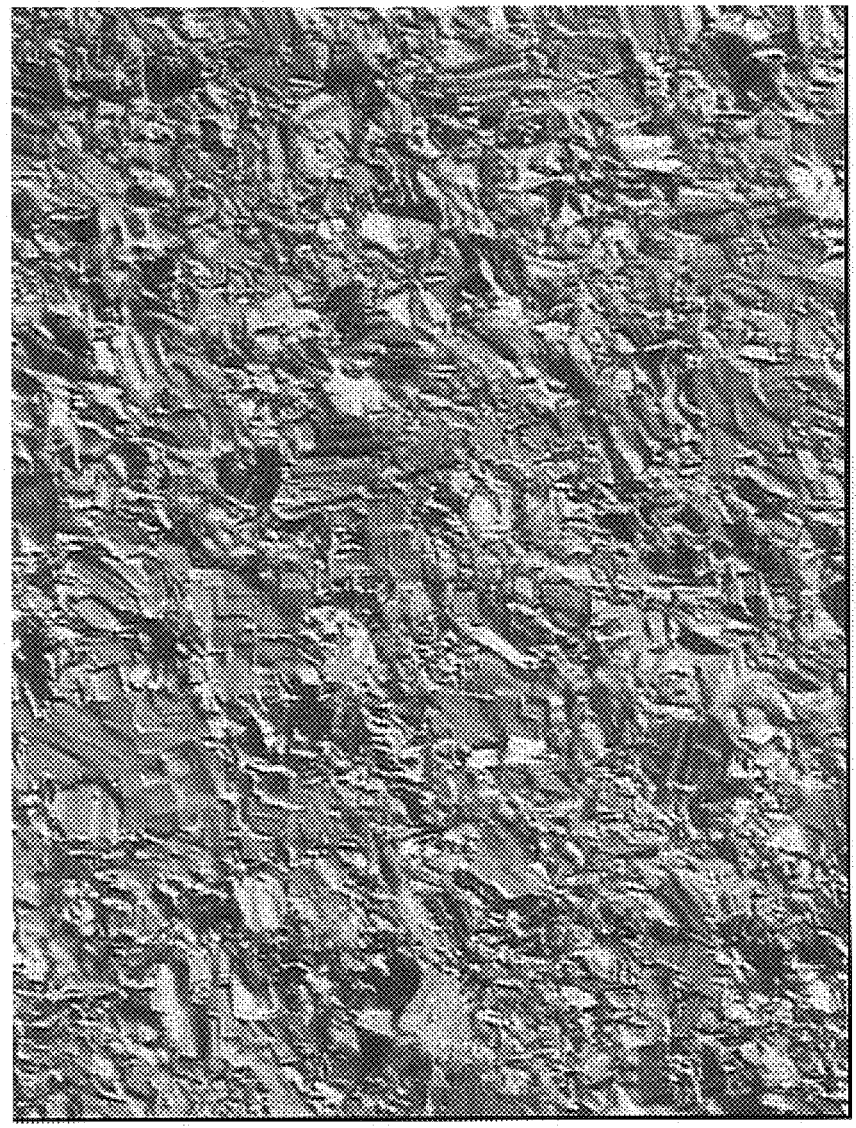
FIG. 21 is a top view optical microscope picture of a sample ceramic/spin-on oxide/AIC layer with double spin-on oxidelayer after epitaxial growth (127×95.5 μm$^2$).

FIG. 19 and FIG. 21 show top view optical microscope pictures of a sample ceramic 1a/spin-on oxide 1b/AIC layer 2a after epitaxial growth. In FIG. 19, the FOx layer 1b consists of a single layer. In FIG. 21, the spin-on oxide layer 1b consists of a double spin-on oxide layer. It can be seen that in case of the double FOx layer, bigger structures are obtained than in the case of a single spin-on oxide layer, which is an indication of bigger grains, and thus better epitaxial quality.

These results illustrate that macroflattening has an advantageous effect on grain sizes obtained by epitaxial growth onto an MIC seed layer (e.g., larger grain sizes are obtained).

Although the invention has been described with reference to embodiments and examples, it should be understood that numerous and various modifications can be made without departing from the spirit of the invention. Accordingly, the invention is limited only by the following claims.

What is claimed is:

1. A method of forming a crystalline silicon layer on a face of a substrate, the face being microrough prior to forming the layer, comprising:
   providing a substrate, wherein the substrate comprises at least one material selected from the group consisting of a ceramic material, glass, a glass-ceramic material, mullite, alumina, and silicon nitride, and wherein a microroughness of a face of the substrate is higher than 2 rad/μm;
   depositing a layer of a dielectric on the face of the substrate by at least one method selected from the group consisting of spinning on the dielectric, flowing on the dielectric, and dipping on the dielectric, wherein a microroughness of a surface of the dielectric layer is less than 1 rad/μm;
   depositing a metal on the surface of the dielectric layer;
   oxidizing the metal;
   depositing silicon on the metal;
   annealing the metal and the silicon; and
   removing the metal, whereby a crystalline silicon layer on the dielectric layer is obtained.

2. The method according to claim 1, wherein the dielectric layer comprises a spin-on glass, $SiO_2$, or an oxide other than $SiO_2$.

3. The method according to claim 1, further comprising:
   epitaxially depositing a silicon layer on the face; and
   constructing a solar cell from the substrate with crystalline silicon layer.

4. The method according to claim 3, wherein the constructing of the solar cell comprises:
   diffusing phosphor into the crystalline silicon layer;
   passivating the crystalline silicon layer;
   forming metal contacts with the crystalline silicon layer; and
   electrically isolating portions of the crystalline silicon layer from each other.

5. The method according to claim 1, wherein the crystalline silicon layer has grains larger than 5 μm.

6. The method according to claim 1, wherein the crystalline silicon layer has no needle-like grains.

7. The method according to claim 1, wherein the crystalline silicon layer has some grains 10 μm or larger in diameter.

8. The method according to claim 1, further comprising:
   epitaxially depositing a crystalline silicon layer; and
   constructing a solar cell from the substrate with the crystalline silicon layer.

9. The method according to claim 8, wherein the constructing of the solar cell comprises:
   diffusing phosphor into the crystalline silicon layer;
   passivating the crystalline silicon layer;
   forming metal contacts with the crystalline silicon layer; and
   electrically isolating portions of the crystalline silicon layer from each other.

10. The method of claim 1, wherein a maximum deviation from an average level line exceeds 50 nm for the face of the substrate, the method further comprising macroflattening the face of the substrate, wherein macroflattening is conducted before depositing a layer of a dielectric on the face of the substrate.

11. The method of claim 1, wherein the metal is aluminum.

* * * * *

UNITED STATES PATENT AND TRADEMARK OFFICE
CERTIFICATE OF CORRECTION

PATENT NO. : 7,662,702 B2
APPLICATION NO. : 11/146564
DATED : February 16, 2010
INVENTOR(S) : Van Gestel et al.

It is certified that error appears in the above-identified patent and that said Letters Patent is hereby corrected as shown below:

| Issued Patent | | 1. Description of Discrepancy |
|---|---|---|
| Column | Line | |
| 3 | 40 | After "AIC" insert --.--. |
| 3 | 41 | After "AIC" insert --.--. |
| 3 | 42 | After "1" insert --.--. |
| 3 | 44 | After "AIC" insert --.--. |
| 3 | 46 | After "AIC" insert --.--. |
| 3 | 48 | After "AIC" insert --.--. |
| 3 | 49 | After "AIC" insert --.--. |
| 3 | 51 | After "sample" insert --.--. |
| 3 | 52 | After "sample" insert --.--. |
| 3 | 54 | After "sample" insert --.--. |
| 3 | 56 | After "sample" insert --.--. |
| 11 | 45 (Approx.) | Change "sa maller" to --smaller--. |

Signed and Sealed this
Fifteenth Day of November, 2011

David J. Kappos
*Director of the United States Patent and Trademark Office*